United States Patent
Amano et al.

[11] Patent Number: 6,072,743
[45] Date of Patent: Jun. 6, 2000

[54] HIGH SPEED OPERABLE SEMICONDUCTOR MEMORY DEVICE WITH MEMORY BLOCKS ARRANGED ABOUT THE CENTER

[75] Inventors: Teruhiko Amano; Takahiro Tsuruda; Kazutami Arimoto; Tetsushi Tanizaki; Takeshi Fujino; Mitsuya Kinoshita; Fukashi Morishita; Mako Kobayashi, all of Hyogo, Japan

[73] Assignee: Mitsubishi Denki Kabushiki Kaisha, Tokyo, Japan

[21] Appl. No.: 09/110,688

[22] Filed: Jul. 7, 1998

[30] Foreign Application Priority Data

Jan. 13, 1998 [JP] Japan .................................. 10-004908

[51] Int. Cl.[7] ...................................................... G11C 8/00
[52] U.S. Cl. ....................................... 365/230.03; 365/233
[58] Field of Search .......................... 365/185.11, 230.03, 365/233

[56] References Cited

U.S. PATENT DOCUMENTS 5,640,362  6/1997  Yoo .......................................... 365/233
5,666,322  9/1997  Conkle ................................ 365/230.03
5,812,490  9/1998  Tsukude .............................. 365/230.03
5,894,448  4/1999  Amano et al. ...................... 365/230.03

FOREIGN PATENT DOCUMENTS 8-116036  5/1996  Japan .
9-74171  3/1997  Japan .

OTHER PUBLICATIONS

"A 1.6GB/s Data–Rate 1Gb Synchronous DRAM with Hierarchical Square–Shaped Memory Block and Distributed Bank Architecture", Y. Nitta et al., 1996 IEEE International Solid–State Circuits Conference 1996 Digest of Technical Papers.
"Super LSI Memory", K. Ito, published by Baifukan, pp. 19.

Primary Examiner—David Nelms
Assistant Examiner—VanThu Nguyen
Attorney, Agent, or Firm—McDermott, Will & Emery

[57] ABSTRACT

A master control circuit provides access to a corresponding memory block via four local control circuits. The memory blocks are arranged so as to surround the master control circuit and the local control circuits. The amount of delay of a control signal to each memory block is set substantially equal to suppress skew in the control signal. A DRAM of high speed can be realized.

7 Claims, 28 Drawing Sheets

WHEN 2 TO THE M-TH POWER BITS,
WHERE M IS AN EVEN NUMBER
FOR EXAMPLE, ARRANGEMENT OF 2
TO THE 4TH POWER BITS = 16 BITS

WHEN 2 TO THE M-TH POWER BITS,
WHERE M IS AN ODD NUMBER
FOR EXAMPLE, ARRANGEMENT OF 2
TO THE 3RD POWER BITS = 8 BITS

HIGH SPEED OPERABLE SEMICONDUCTOR MEMORY DEVICE WITH MEMORY BLOCKS ARRANGED ABOUT THE CENTER

BACKGROUND OF THE INVENTION

1. Field of the Invention

The present invention relates to semiconductor memory devices, and more particularly to an arrangement of memory blocks in a semiconductor memory device and an arrangement of a peripheral circuit thereof.

2. Description of the Background Art

Increase in the capacity of a semiconductor memory device, particularly in a dynamic random access memory (DRAM), has seen significant development. A DRAM is a versatile memory that is often incorporated in a standard memory module (SIMM: single in-line memory module; DIMM: dual in-line memory module).

FIG. 27 shows an example of a memory block arrangement of a 64-Mbit DRAM. Such a DRAM is disclosed in, for example, FIG. 1.14 on page 19 in "Super LSI Memory" by Kiyoh Ito published by Baifukan.

Referring to FIG. 27, the DRAM includes a semiconductor substrate 2000, and memory blocks MB16a, MB16b, MB16c and MB16d of 16M bits formed on semiconductor substrate 2000.

Each of memory blocks MB16a–MB16d includes a column decoder CDa and row decoder RRCa.

In the DRAM shown in FIG. 27, four 16-Mbit memory blocks having an aspect ratio of approximately 1:2 are arranged in two rows and two columns. Therefore, semiconductor substrate 2000 has an aspect ratio of approximately 1:2.

In the center region CRS extending from the center of one short side of semiconductor substrate 2000 towards the center of the opposite short side of semiconductor substrate 2000 are arranged an input/output interface circuit (not shown) and pads for input and output. In the center region CRL extending from the center of one long side to the center of the opposite long side of semiconductor substrate 2000 are arranged a peripheral circuit for the control of the memory array.

The input/output interface circuit functions to convert an externally applied control signal and write data into internal signals and supply the internal signal to a control circuit. The input/output interface circuit also provides the readout data transferred from a memory block to a control circuit to an external source.

The peripheral circuit provides control of a memory block according to a control signal or data applied to the input/output interface circuit.

The 16-Mbit memory block is internally divided into a plurality of subblocks (not shown). The 16-Mbit memory block includes a row decoder of the X direction and a column decoder of the Y direction.

At the current stage, a DRAM package has an aspect ratio of approximately 1:2. This is attributed to the aspect ratio of 1:2 of the DRAM chip.

FIG. 28 is a diagram for describing the configuration of a memory cell of a DRAM formed of the general one transistor-one capacitor.

Referring to FIG. 28, a memory cell MC includes a capacitor MQ1 connected between a cell plate CP and a storage node SN1 for storing information, and an access transistor MT1 for connecting storage node SN1 with a bit line BL. Bit line BL is connected to a sense amplifier SA together with a bit line /BL which is the counter electrode. When word line WL1 is activated so that the information stored in capacitor MQ1 is read out to bit line BL, the sense amplifier amplifies the potential difference between bit lines /BL and BL to output data.

Although only one bit line BL is connected to one memory cell, another bit line /BL which is a counter electrode is required to read out data from the memory cell. Therefore, it is typical to form a memory cell of 1 bit with one word line and one pair of bit lines (bit lines BL and /BL) in implementing a memory array. Since the word line and the bit lines are fabricated under the smallest rule, the aspect ratio of a 1-bit memory cell is approximately 1:2.

FIGS. 29A and 29B are schematic diagrams for describing the configuration of memory blocks.

Memory blocks D44 and D28 show the formation of memory blocks having a plurality of memory cells corresponding to 2 to the m-th power bits where m is an even number. Memory block D44 has memory cells of the aspect ratio of 1:2 arranged in four rows and four columns. Memory block D28 has memory cells arranged in 8 rows and 2 columns.

The memory blocks have a ratio of a longer side to the shorter side of 2:1.

Memory blocks D42 and D24 show formation of memory blocks having a plurality of memory cells corresponding to 2 to the m-th power bits where m is an odd number. Memory block D42 has memory cells arranged in 2 rows and 4 columns. In this case, the ratio of the longer side to the shorter side of the memory block is 4:1. Memory block D24 has memory cells arranged in 4 rows and 2 columns. In this case, the memory block has substantially a square configuration.

When a DRAM is incorporated into the memory module, it is desirable to accommodate the DRAM in the same package even if the capacity of the DRAM is large. For example, the chip size of the DRAM per se is reduced by the advanced technique of microminiaturization to be accommodated into a package of the same size even when the capacity of the DRAM is fourfold from 4M bits to 16M bits.

A package of a different size induces the need to fabricate different module substrates corresponding to each size. If the size of the package for a DRAM of a higher generation with a larger capacity can be suppressed to a level identical to that of a conventional package, the conventional module substrate can be used without any great modification (or with only a slight modification). This is advantageous in the fabrication of a memory module of a great capacity.

However, it is expected that the technological advance in microminiaturization for achieving a chip size that allows a 256-Mbit DRAM of a generation succeeding the current 64-Mbit DRAM to be accommodated in a chip of a size (400 mil-width package) identical to the size of the current 64-Mbit DRAM will not yet be available for some time.

At the present stage, it is convenient if a DRAM having a capacity of 128M bits can be accommodated in a package of a size identical to that of the current 64-Mbit DRAM.

Consider the configuration of a 128-Mbit DRAM chip. Since the 128-Mbit DRAM has a capacity of 2 to the m-th power bits where m is an odd number, it is difficult to achieve an aspect ratio of 1:2 by a normal fabrication process as described above.

FIGS. 30 and 31 are diagrams for describing the array configuration of a 128-Mbit DRAM.

Referring to FIG. 30, two of a 64-Mbit memory block MB64 having an aspect ratio of 1:2 are arranged laterally in one row on a semiconductor substrate 2100. Such an arrangement will result in a 128-Mbit DRAM of a chip configuration having an aspect ratio of 1:4.

Referring to FIG. 31, 64-Mbit memory blocks MB64 are arranged vertically in one column on a semiconductor substrate 2200. Such an arrangement will result in a 128-Mbit DRAM having a square chip with an aspect ratio of 1:1.

If the 128-Mbit DRAM is to be accommodated in a general 64-Mbit DRAM package having an aspect ratio of approximately 1:2, microminiaturization of an extremely high level is required. More specifically, a shrink rate of approximately two times smaller than that in fabricating a 64-Mbit DRAM will be required. This is not easy to realize.

FIG. 32 is a diagram for describing an arrangement of a conventional peripheral circuit of a DRAM.

The DRAM includes a semiconductor substrate 2300, memory blocks MBn arranged in two rows and two columns on semiconductor substrate 2300, power supplies IPS1 and IPS2 arranged in a center region CRS corresponding to the shorter sides of semiconductor substrate 2300, a data input/output interface DI, an address input buffer ABUF, a clock buffer CKB, a PLL circuit PL receiving a clock from clock buffer CKB for generating an internal clock of the same phase, and a control circuit CC arranged at a center region CRL corresponding to the longer side of semiconductor substrate 2300.

In such a chip arrangement, PLL circuit PL cannot always be placed at a position having equal distance from all the memory blocks. There is a possibility that the time of an internal clock generated in PLL circuit PL arriving at each memory block is not equal, so that there is offset in the clock time (skew) of each memory block.

SUMMARY OF THE INVENTION

An object of the present invention is to provide a semiconductor memory device maintaining a chip aspect ratio of approximately 1:2 and having an optimum memory configuration and control circuit arrangement as a DRAM in producing a 128-Mbit DRAM (or a DRAM with a capacity of 2 to the (2 m+1)th power where m is a natural number).

According to an aspect of the present invention, a semiconductor memory device is formed on a main surface of a semiconductor substrate divided into chips. The semiconductor memory device includes a plurality of memory blocks and a control circuit. The plurality of memory blocks are arranged so as to surround the center at the main surface of the semiconductor substrate.

Each memory block includes a plurality of word lines, a plurality of bit lines crossing the plurality of word lines, and a plurality of memory cells corresponding to respective crossings of the plurality of word lines and the plurality of bit lines.

The control circuit provides a control signal to the plurality of memory blocks at the center area of the main surface of the semiconductor substrate. The control circuit includes a master control circuit arranged at the center for generating a reference signal which becomes the reference of control for all the plurality of memory blocks, and a plurality of local control circuits arranged so as to surround the master control circuit. Each local control circuit receives the reference signal to output a control signal to a corresponding memory block.

According to another aspect of the present invention, a semiconductor memory device is formed on a main surface of a semiconductor substrate divided into chips. The semiconductor memory device includes eight memory blocks and a control circuit.

The eight memory blocks are arranged at a region divided into three rows and three columns, excluding the region of the second row and the second column. Each memory block includes a plurality of word lines, a plurality of bit lines crossing the plurality of word lines, and a plurality of memory cells corresponding to respective crossings of the plurality of word lines and the plurality of bit lines.

The control circuit is arranged at the region of the second row and the second column to provide a control signal to the plurality of memory blocks. The control circuit includes a master control circuit arranged at the center of the control circuit for generating a reference signal that becomes the reference for control of all the plurality of memory blocks, and four local control circuits arranged at the four corners of the region of the second row and the second column. The local control circuit receives the reference signal to output a control signal to a corresponding memory block.

The main advantage of the present invention is that the chip aspect ratio of approximately 1:2 can be maintained by the optimum memory configuration and control circuit arrangement in producing a 128-Mbit DRAM (or a DRAM having a capacity of 2 to the (2 m+1) power where m is a natural number). Since this chip configuration is suitable for accommodation in a package oriented to a conventional DRAM, the package for the conventional DRAM can be used without significant advance in microminiaturization of elements.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
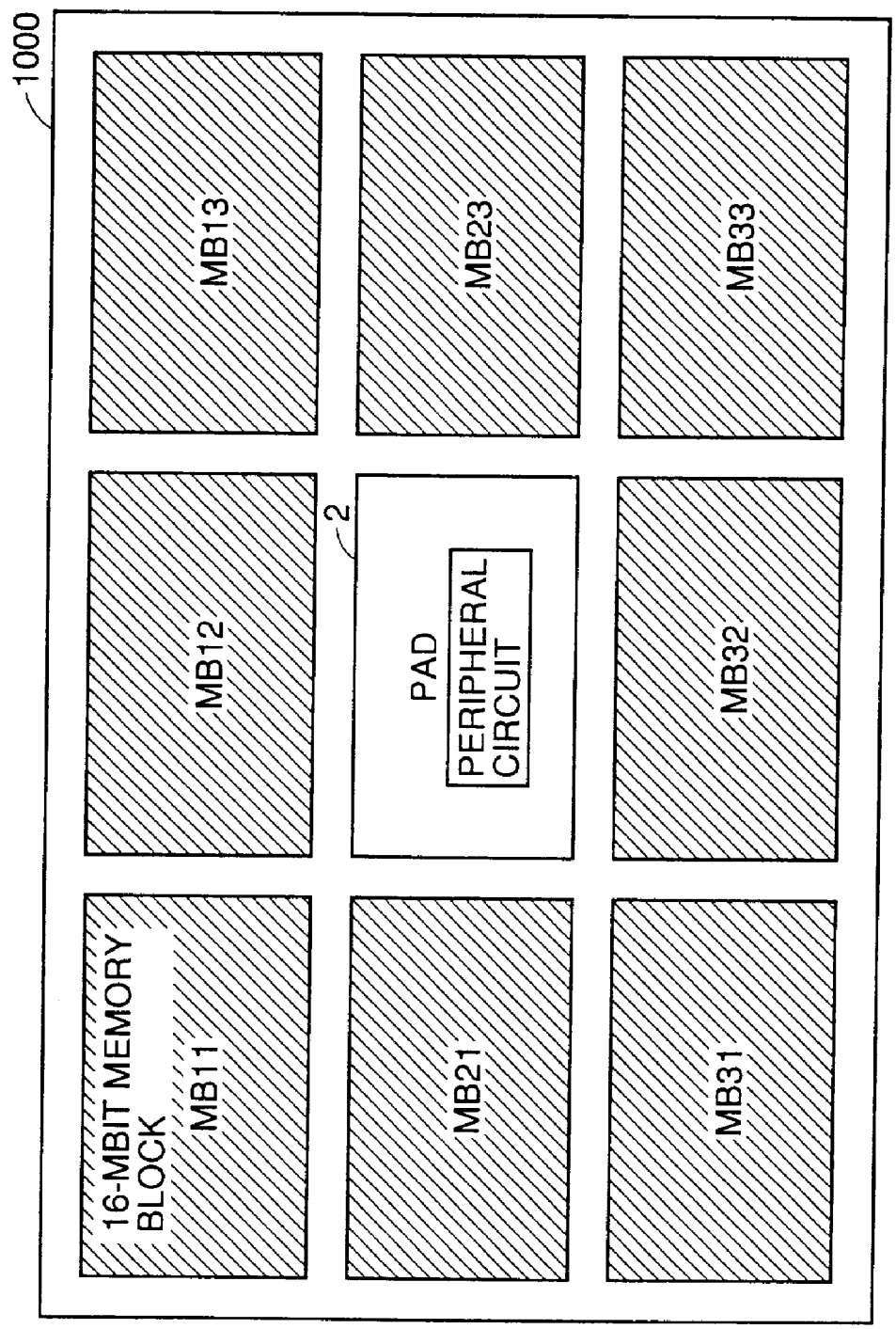
FIG. 1 shows a structure of a semiconductor memory device according to a first embodiment of the present invention.

Embodiments of the present invention will be described hereinafter with reference to the drawings. In the drawings, the same reference characters indicate the same or corresponding components.

First Embodiment

FIG. 1 schematically shows a chip layout of a semiconductor memory device according to a first embodiment of the present invention.

Referring to FIG. 1, a semiconductor memory device is formed on a semiconductor substrate 1000.

Semiconductor substrate 1000 is divided into three in the vertical and horizontal directions to result in 9 regions. Eight memory blocks are arranged in these regions of three rows and three columns, excluding the center region 2 of the second row and the second column. Each memory block has an aspect ratio of approximately 1:2 and a capacity of 16M bits. The semiconductor memory device forms a memory of 128M bits. A memory block MB11 is arranged at the region of the first row and the first column. A memory block MBmn is arranged at the m-th row and the n-th column (m and n are natural numbers of 1–3, provided that the second row and second column are excluded).

At center region 2 located at the second row and the second column are provided an input/output pad, an interface circuit, input buffer circuits of an address signal and a control signal, a memory array control circuit, an internal power supply and the like.

Figure 2:
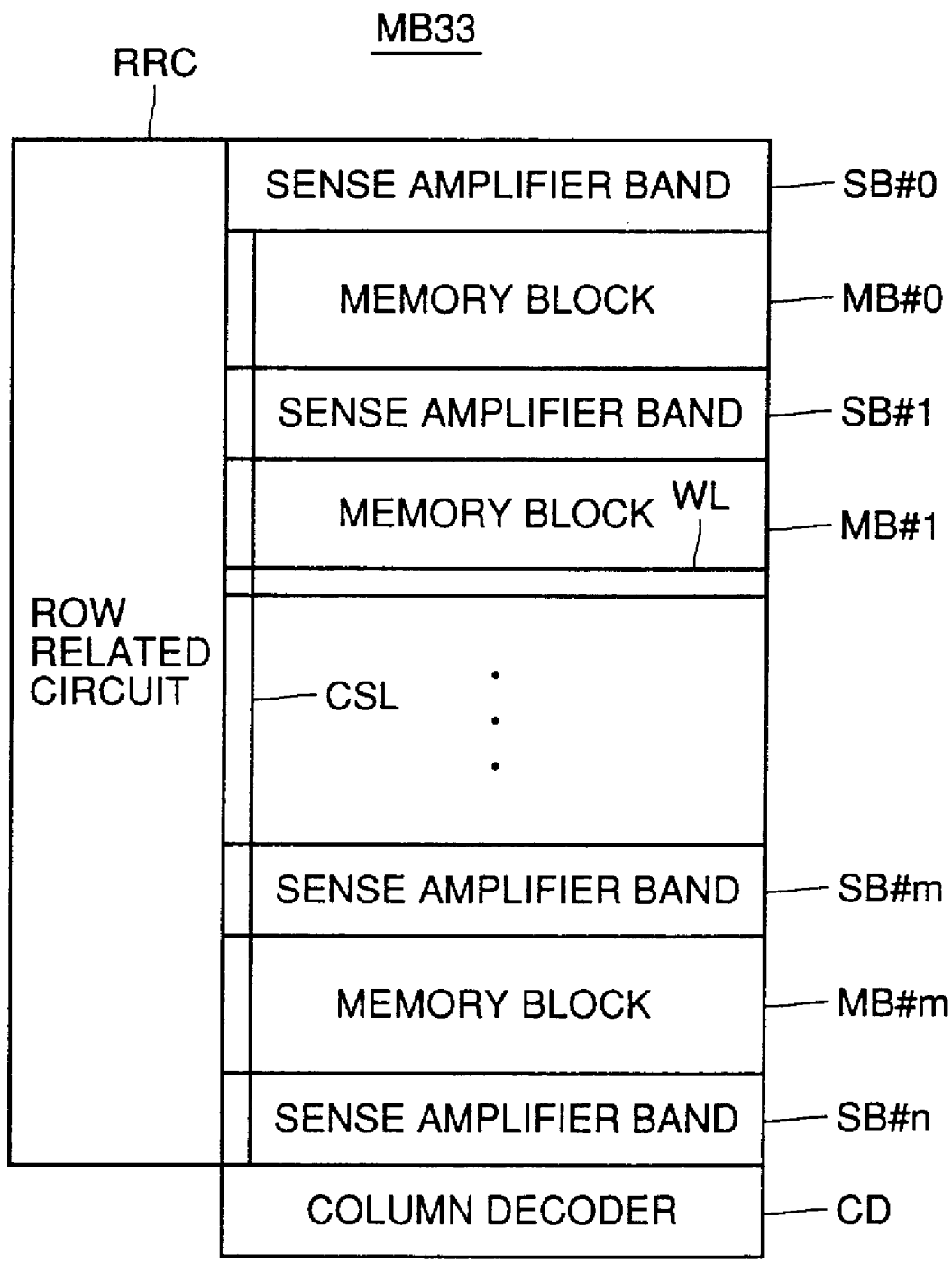
FIG. 2 is a schematic diagram showing the arrangement of a memory block MB33 of FIG. 1.

FIG. 2 schematically shows a structure of a memory block MB33 of the semiconductor memory device of FIG. 1. The eight memory blocks each have a similar structure. Therefore, the structure of memory block MB33 will be described representative thereof.

Referring to FIG. 2, memory block MB33 is divided into a plurality of memory blocks MB#0–MB#m, each having a plurality of memory cells arranged in a matrix.

Sense amplifier bands SB#1–SB#m for sensing and amplifying data in the column of a corresponding memory block at the time of activation are arranged between memory blocks MB#0–MB#m. Also, respective sense amplifier bands SB#0 and SB#n are arranged at each outer side of memory blocks MB#0 and MB#m.

More specifically, sense amplifier band SB#1 is commonly shared by memory blocks MB#0 and MB#1 located at respective sides. Sense amplifier band SB#m is commonly shared by the memory block MB#m and a memory block MB#m−1 not shown.

This arrangement of sharing these sense amplifier bands (generically indicating sense amplifier bands SB#1–SB#m) by their both sides of memory block is known as a "shared sense amplifier structure". A selected memory block (a block including the selected memory cell) is connected to a corresponding sense amplifier band. The counterpart non-selected memory block is disconnected from the corresponding sense amplifier band.

When the memory blocks at either side of a sense amplifier band are both non-selected (do not include a selected memory cell), these memory blocks are connected to the sense amplifier band to maintain the precharged state.

Along the direction of the longer side of memory block MB33, a row related circuit RRC for carrying out an operation related to row selection of a memory cell is arranged. Also, a column decoder CD is arranged adjacent to sense amplifier band SB#n.

Row related circuit RRC includes a row decode circuit provided corresponding to memory blocks MB#0–MB#m, respectively. This row decode circuit drives a word line WL corresponding to an addressed memory cell row according to an address signal provided through a path that will be described afterwards to a selected state.

In FIG. 2, one typical word line WL is depicted in memory block MB#1. Column decoder CD decodes an address signal not shown to generate a column select signal for selecting the addressed column. The select signal from column decoder CD is transmitted on a column select signal transmission line CSL. Column select signal transmission line CSL is arranged extending over all the memory blocks MB#0–MB#m along the direction of the longer side of memory block MB33 so as to be shared by all memory blocks MB#0–MB#m.

Figure 3:
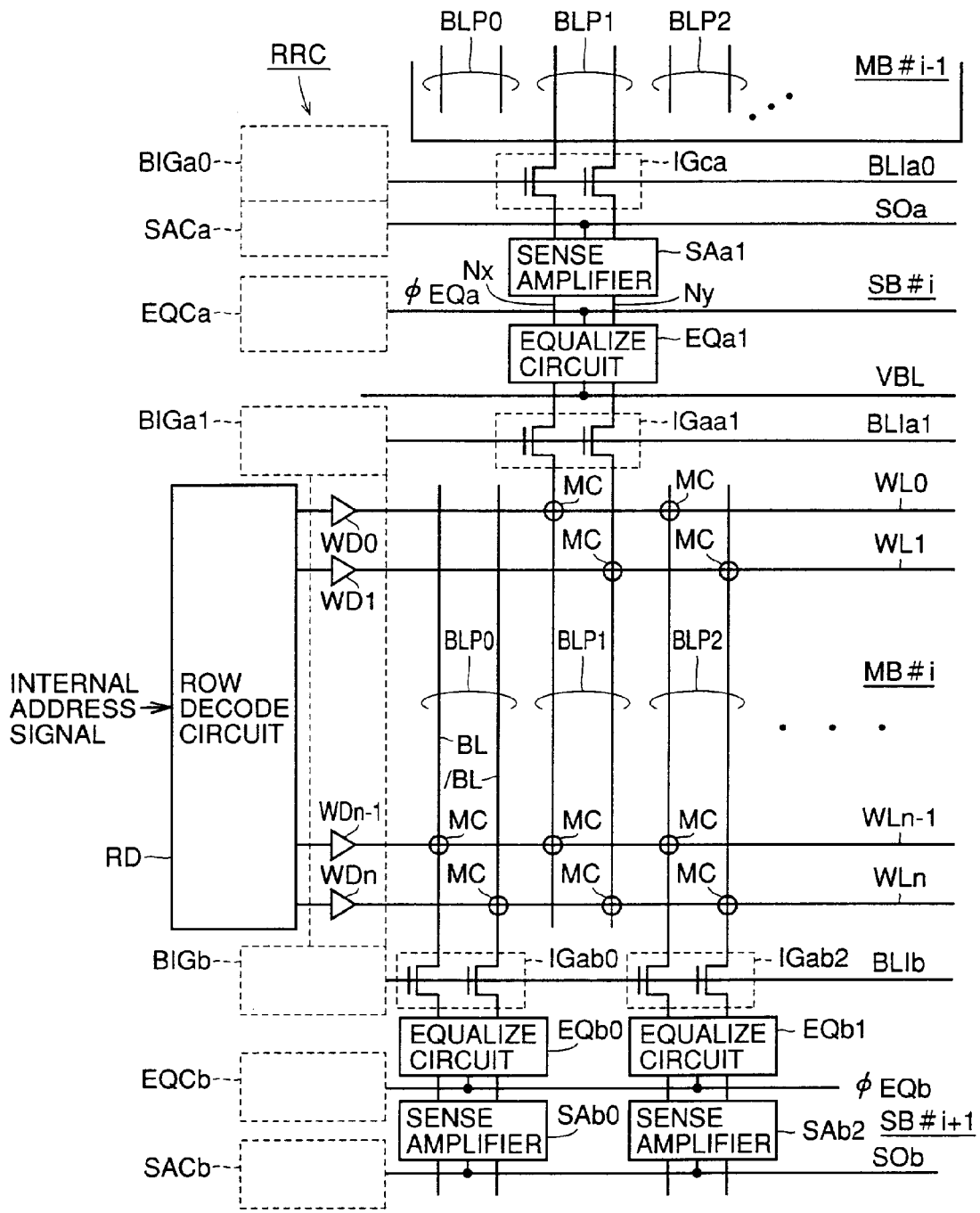
FIG. 3 is a circuit diagram showing partial enlargement of the memory block of FIG. 2.

FIG. 3 schematically shows a structure of one memory block out of memory blocks MB#0–MB#m in memory block MB33 of FIG. 2 and sense amplifier bands located at respective sides thereof. FIG. 3 schematically shows a structure of memory block MB#i.

Referring to FIG. 3, memory block MB#i includes a plurality of memory cells MC arranged in a matrix, a plurality of word lines WL0–WLn arranged corresponding to each row of memory cells, each word line being connected to a memory cell MC of a corresponding row, and a plurality of bit line pairs BLP arranged corresponding to each column of memory cells MC, each bit line pair being connected to a memory cell of a corresponding column.

In FIG. 3, three bit line pairs BLP0, BLP1 and BLP2 are typically shown. Each of bit line pairs BLP0–BLP2 includes bit lines BL and /BL through which complementary data signals are transmitted. Memory cell MC is arranged corresponding to the crossing of a word line WL (generically indicating WL0–WLn) and a pair of bit lines BL and /BL.

A sense amplifier band SB#i arranged between memory blocks MB#i-1 and MB#i includes a sense amplifier SAaj+1 provided corresponding to an odd numbered bit line pair BLPj+i of memory blocks MB#i-1 and MB#i.

In FIG. 3, a typical sense amplifier SAa1 provided corresponding to bit line pair BLP1 is shown. A bit line equalize circuit EQa for equalizing a corresponding bit line pair to a predetermined intermediate potential VBL at the time of activation is provided adjacent to sense amplifier SAa1. This equalize circuit is typically shown as equalize circuit EQa1 provided adjacent to sense amplifier SAa1 in FIG. 3.

The sense amplifier (SAa1) of sense amplifier band SB#i is connected to an odd numbered bit line pair (BLP1) of memory block MB#i-1 via a bit line isolation gate IGca rendered conductive in response to a bit line isolation control signal BLIa0, and electrically connected to an odd numbered bit line pair (BLP1) of memory block Mb#i via a bit line isolation gate IGaa (IGaa1) rendered conductive in response to a bit line isolation control signal BLIa1.

Sense amplifier band SB#i+1 includes a sense amplifier SAb (SAb0, SAb2, . . .) provided corresponding to an even numbered bit line pair (BLP0, BLP2, . . .) of memory block MB#i and memory block MB#i+1 not shown.

Sense amplifier band SB#i+1 further includes a bit line equalize circuit EQb (EQb0, EQb1, . . .) provided adjacent to a sense amplifier SAb (SAb0, SAb2, . . .), and that precharges and equalizes a corresponding bit line pair BLP (BLP0, BLP2, . . .) at an intermediate potential level when an equalize designation signal $\phi$EQb is active.

Sense amplifier SAb (SAb0, SAb2, . . .) of sense amplifier band SB#i+1 is electrically connected to an even numbered bit line pair BLP (BLP0, BLP2, . . .) of a corresponding memory block MB#i via a bit line isolation gate IGab (IGab0, IGab2, . . .) rendered conductive in response to a bit line isolation control signal BLIb. Sense amplifier SAb (SAb0, SAb2, . . .) of sense amplifier band SB#i+1 is electrically connected to an even numbered bit line pair of memory block MB#i+1 not shown via a corresponding bit line isolation gate.

Row related circuit RRC corresponding to memory block MB#i includes a row decode circuit RD for decoding an internal address signal (including a memory block designation address) for generating a signal to select a word line corresponding to an addressed row, and word line drive circuits WD0–WDn provided corresponding to word lines WL0–WLn, respectively, for driving a corresponding word line to a selected state according to a row select signal from row decode signal RD.

Row related circuit RRC further includes a bit line isolation control circuit BIGa0 for providing a bit line isolation control signal BLIa0 according to an address signal and a timing signal not shown, a sense amplifier control circuit SACa for activating and providing to each sense amplifier SAa (SAa1, . . .) of sense amplifier band SB#i a sense amplifier activation signal SOa according to a block address signal and a sense amplifier activation signal, an equalize control circuit EQCa for providing an equalize designation signal $\phi$EQa to an equalize circuit EQa (EQa1, . . .) in sense amplifier band SB#i according to a block address signal and a timing signal, and a bit line isolation control circuit BIGa1 for providing the output bit line isolation control signal BLIa1 to bit line isolation gate IGaa (IGaa1, . . .) according to a block address signal and a timing signal.

Row related control circuit RRC further includes a bit line isolation control circuit BIGb for providing the output of bit line isolation control signal BLIb to a bit line isolation gate IGab (IGab0, IGab2, . . .) according to a block address signal and a timing signal, an equalize control circuit EQCb for providing the output of equalize designation signal $\phi$EQb to an equalize circuit EQb (EQb0, EQb1, . . .) according to a block address signal and a timing signal, and a sense amplifier control circuit SACb for providing a sense amplifier activation signal SOb to a sense amplifier SAb (SAb0, SAb2, . . .) according to a block address signal and a timing signal.

These row related circuits effect operation in relation to a row select operation of memory block MB#i, and has its activation timing determined by a row address strobe signal /RAS that will be described afterwards.

Figure 4:
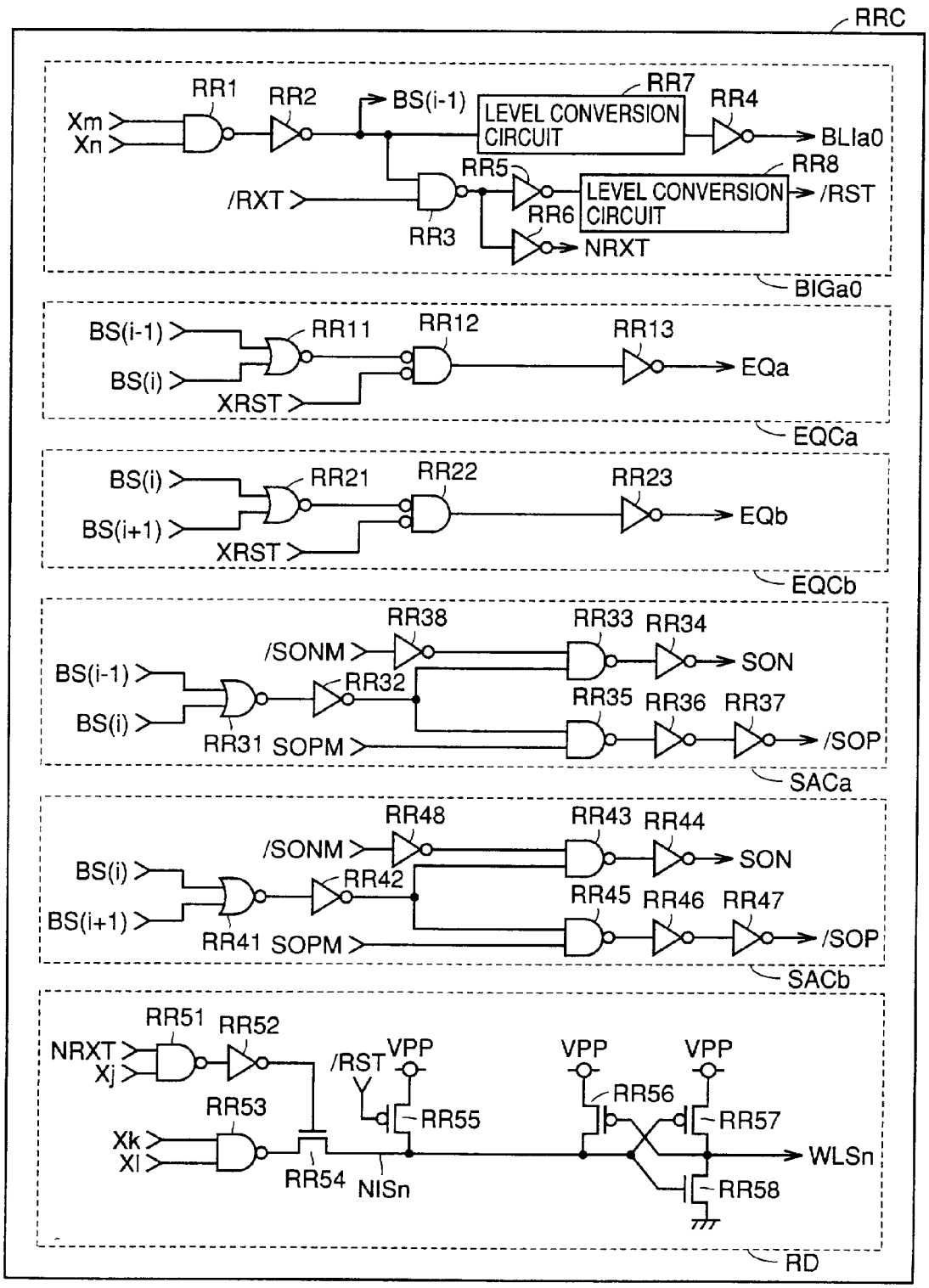
FIG. 4 is a circuit diagram showing a structure of a row related circuit RRC of FIG. 3.

FIG. 4 schematically shows a structure of a row related control circuit RRC.

Referring to FIG. 4, row related circuit RRC includes a bit line isolation control circuit BIGa0 for providing a block address signal BS(i-1), a bit line isolation control signal BLIa0, and timing signals /RST, NRXT according to internal address signals Xm, Xn generated at a peripheral circuit arranged at the center of the chip and a timing signal /RXT generated at a peripheral circuit according to a row address strobe signal in response to an externally applied address signal, an equalize control circuit EQCa for providing an equalize designation signal EQa according to a block address signal BS(i-1) generated from bit line isolation circuit BIGa0, a timing signal XRST, and a block address signal BS(i) generated from bit line isolation circuit BIGa1, an equalize control circuit EQCb for providing an equalize designation signal EQb according to block address signals BS(i), BS(i+1) and timing signal XRST, a sense amplifier control circuit SACa for activating sense amplifier activation signals SON and /SOP according to block address signals BS(i-1) and BS(i), and sense amplifier activation signals SOPM, /SONM generated at a peripheral circuit according to a row address strobe signal, a sense amplifier control circuit SACb for activating sense amplifier activation signals SON, /SOP according to block address signals BS(i), BS(i+1) and sense amplifier activation signals SOPM, /SONM, and a row decode circuit RD for providing a row select signal WLSn for activating a word line according to internal address signals Xj, Xk, Xl and timing signals NRXT, /RST.

Bit line control isolation circuit BIGa0 includes an NAND circuit RR1 for receiving internal address signals Xm and Xn, an inverter RR2 for receiving and inverting the output of NAND circuit RR1 to provide a memory block select signal BS(i−1), a level conversion circuit RR7 for receiving and converting the level of memory block select signal BS(i−1), and an inverter RR4 for receiving and inverting the output of level conversion circuit RR7 to provide a bit line isolation control signal BLIa0.

Bit line control isolation circuit BIGa0 further includes a NAND circuit RR3 for receiving timing signal /RXT and a memory block select signal BS(i−1), an inverter RR6 for receiving and inverting the output of NAND circuit RR3 to output a timing signal NRXT, an inverter RR5 for receiving and inverting the output of NAND circuit RR3, and a level conversion circuit RR8 for receiving the output of inverter RR5 and converting the level for providing timing signal /RST.

Equalize control circuit EQCa includes an NOR circuit RR11 receiving block address signals BS(i−1), BS(i), a NOR circuit RR12 receiving the output of NOR circuit RR11 and timing signal XRST, and an inverter RR13 for receiving and inverting the output of NOR circuit RR12 to output an equalize designation signal EQa.

Equalize control circuit EQCb includes a NOR circuit RR21 receiving block address signals BS(i), BS(i+1), a NOR circuit RR22 receiving the output of NOR circuit RR21 and timing signal XRST, and an inverter RR23 for receiving and inverting the output of NOR circuit RR22 to provide equalize designation signal EQb.

Sense amplifier control circuit SACa includes a NOR circuit RR31 receiving block address signals BS(i−1), BS(i), an inverter RR32 for receiving and inverting the output of NOR circuit RR31, an inverter RR38 for receiving and inverting sense amplifier activation signal ISONM, a NAND circuit RR33 for receiving the output of inverter RR32 and the output of inverter RR38, an inverter RR34 for receiving and inverting the output of NAND circuit RR33 to output sense amplifier activation signal SON, a NAND circuit RR35 for receiving the output of inverter RR32 and sense amplifier activation signal SOPM, and inverters RR36 and RR37 connected in series for receiving the output of NAND circuit RR35 to output sense amplifier activation signal /SOP.

Sense amplifier control circuit SACb includes a NOR circuit RR41 for receiving block address signals BS(i), BS(i+1), an inverter RR42 for receiving and inverting the output of NOR circuit RR41, an inverter RR48 for receiving and inverting sense amplifier activation signal /SONM, a NAND circuit RR43 for receiving the output of inverter RR42 and the output of inverter RR48, an inverter RR44 for receiving and inverting the output of NAND circuit RR43 to output sense amplifier activation signal SON, a NAND circuit RR45 for receiving the output of inverter RR42 and sense amplifier activation signal SOPM, and inverters RR46 and RR47 connected in series for receiving the output of NAND circuit RR45 to output sense amplifier activation signal /SOP.

Row decode circuit RD includes a NAND circuit RR53 for receiving internal address signals Xk, Xl, a NAND circuit RR51 for receiving internal address signal Xj and timing signal NRXT generated by bit line control isolation circuit BIGa0, an inverter RR52 for receiving and inverting the output of NAND circuit RR51, an N channel transistor RR54 for providing the output of NAND circuit RR53 to a node NISn according to the output of inverter RR52, a P channel transistor RR55 for providing an internal boosted potential Vpp to node NISn according to timing signal /RST, a P channel transistor RR57 having a gate connected to node NISn and a source coupled to internal boosted potential Vpp, an N channel transistor RR58 having a gate connected to node NISn, a source coupled to a ground potential, and a drain connected to the drain of P channel transistor RR57, and a P channel transistor RR56 having a gate connected to the drain of P channel transistor RR57, and node NISn coupled to internal boosted potential Vpp. A row select signal WLSn is output from the drain of P channel transistor RR57.

In FIG. 4, the portion of providing the n-th row select signal WLSn is typically shown as a portion of row decode circuit RD. Row select signal WLSn activates word line WLn corresponding to word line drive circuit WDn described with reference to FIG. 3.

Figure 5:
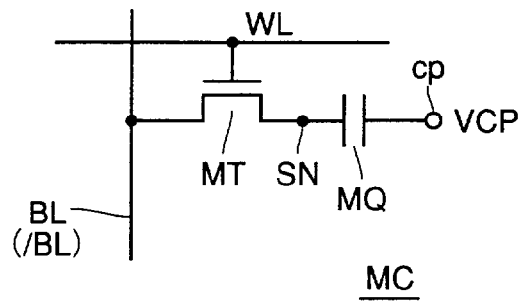
FIG. 5 is a circuit diagram showing a structure of a memory cell MC of FIG. 3.

FIG. 5 schematically shows a structure of memory cell MC of FIG. 3.

Referring to FIG. 5, memory cell MC includes a capacitor MQ for storing information, and an access transistor MT formed of an N channel transistor connecting a storage node SN of capacitor MQ to a bit line BL (or /BL) in response to a signal potential of word line WL. A constant cell plate potential VCP is applied to a cell plate node CP of memory capacitor MQ.

Figure 6:
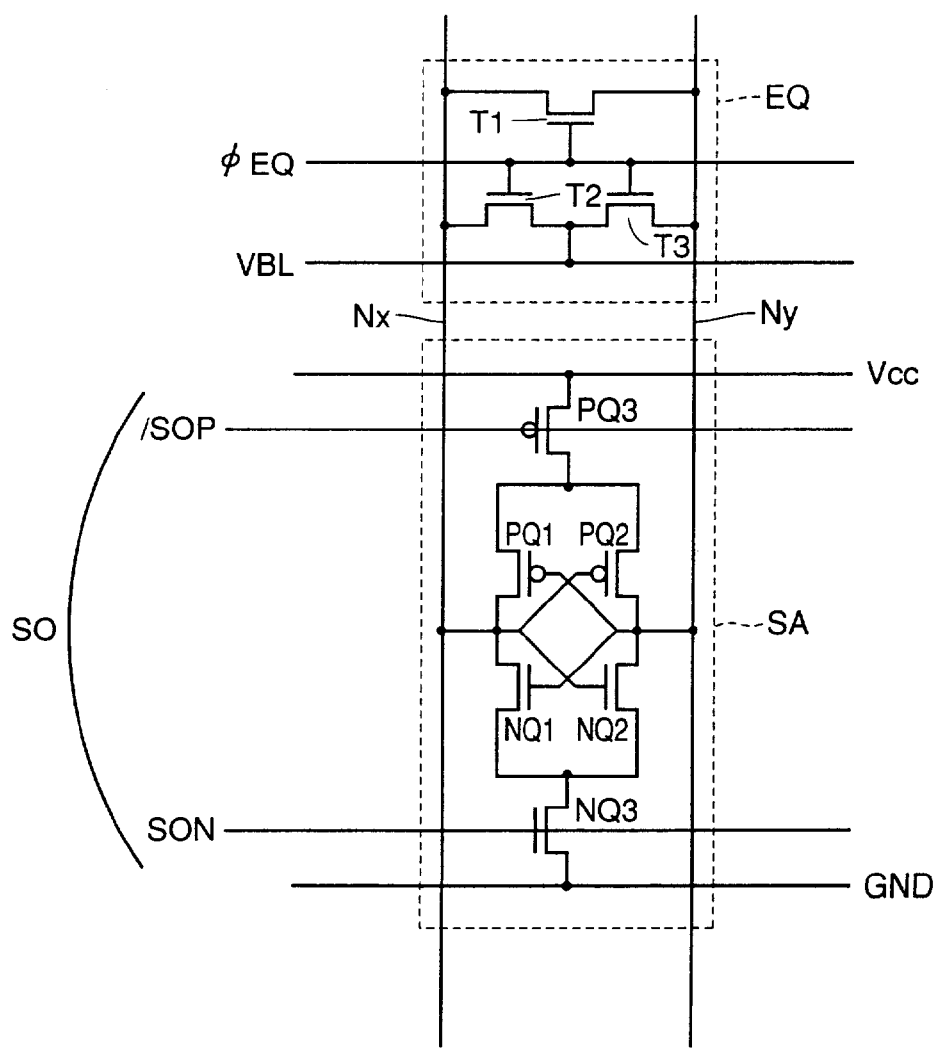
FIG. 6 is a circuit diagram showing a structure of a sense amplifier SA and an equalize circuit EQ of FIG. 3.

FIG. 6 shows a structure of bit line equalize circuit EQ and sense amplifier SA of FIG. 3.

Referring to FIG. 6, equalize circuit EQ includes an N channel transistor T1 rendered conductive in response to equalize designation signal φEQ for electrically connecting nodes Nx and Ny, and N channel transistors T2 and T3 rendered conductive in response to equalize designation signal φEQ to transmit a predetermined precharge potential VBL to nodes Nx and Ny.

Equalize circuit EQ corresponds to equalize circuits EQa1, EQb0 and EQb1 of FIG. 3. Nodes Nx and Ny are electrically connected to a corresponding bit line via a bit line isolation gate.

Sense amplifier SA includes P channel transistors PQ1, PQ2 having the gate and drain cross coupled, N channel transistors NQ1, NQ2 having the gate and drain cross coupled, a P channel transistor PQ3 rendered conductive in response to sense amplifier activation signal /SOP for coupling power supply potential VCC to the source of P channel transistors PQ1 and PQ2, and an N channel transistor NQ3 rendered conductive in response to sense amplifier activation signal SON for coupling ground potential GND to the source of N channel transistors NQ1 and NQ2. P channel transistor PQ1 and N channel transistor NQ1 have their drains connected to node Nx. P channel transistor PQ2 and N channel transistor NQ2 have their drains connected to node Ny.

Sense amplifier activation signals SON and /SOP correspond to sense amplifier activation signals SOa or SOb shown in FIG. 3.

In the first embodiment, eight 16-Mbit memory blocks having an aspect ratio of approximately 1:2 are used according to the arrangement described with reference to FIG. 1 of the memory blocks of FIG. 2. As a result, a 128-Mbit DRAM having an aspect ratio of approximately 1:2 for the entire chip is realized. For the purpose of providing this 128-Mbit DRAM equal in size to be accommodated in a package identical to that of a conventional 64-Mbit DRAM, miniaturization with a shrink rate of approximately 1.5 the 64-Mbit DRAM is required.

Second Embodiment

Figure 7:
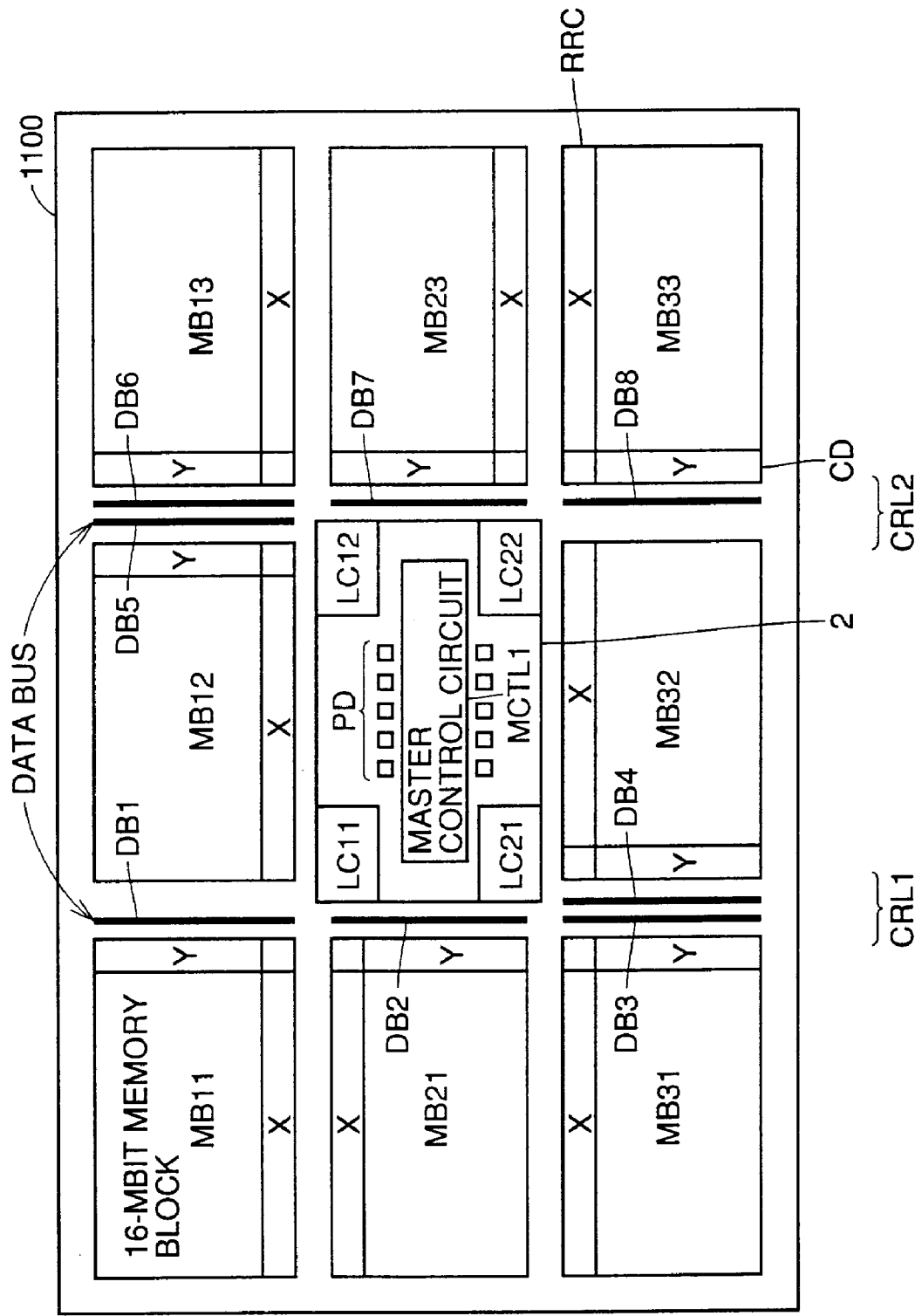
FIG. 7 shows an arrangement of a memory block and a control circuit of a semiconductor memory device according to a second embodiment.

FIG. 7 schematically shows the arrangement of a semiconductor circuit device of a second embodiment of the present invention.

Referring to FIG. 7, the semiconductor memory device of the second embodiment is similar to the semiconductor memory device of the first embodiment in that eight memory blocks are arranged in the region of the main surface of semiconductor substrate 1100 divided into three rows and three columns, excluding the region of the second row and the second column. The semiconductor memory device of the second embodiment includes at the region of the second row and second column a master control circuit MCTL1 for generating a reference signal which becomes the basis of control for all the eight memory blocks, local control circuits LC11, LC12, LC21 and LC22 arranged at the four corners of the region of the second row and the second column for receiving a reference signal for master control circuit MCTL1 and transmitting the same to each memory block, and a pad PD used for data input and output, clock input, and address input.

The semiconductor memory device of the second embodiment further includes a data bus DB1 arranged along the side of the column decoder of memory block MB11 for transmitting the data input and output to and from memory block MB11, a data bus DB2 arranged along the side of the column decoder of memory block MB21 for transmitting data input and output to and from memory block MB21, a data bus DB3 arranged along the column decoder of memory block MB31 for transmitting data input and output to and from memory block MB31, a data bus DB4 arranged along the column decoder of memory block MB32 for transmitting data input and output to and from memory block MB32, a data bus DB5 arranged along the column decoder of memory block MB12 for transmitting data input and output to and from memory block MB12, a data bus DB6 arranged along the column decoder of memory block MB13 for transmitting data input and output to and from memory block MB13, a data bus DB7 arranged along the column decoder of memory block MB23 for transmitting data input and output to and from memory block MB23, and a data bus DB8 arranged along the column decoder of memory block MB33 for transmitting data input and output to and from memory block MB33.

Each memory block includes a row related circuit RRC arranged at one side in the direction of the longer side of that block for selecting a word line in response to an internal row address signal, and a column decoder arranged at one side in the direction of the shorter side of that block for selecting a bit line in response to an internal column address signal.

The arrangement of data bus DB5 transmitting data input and output to and from memory block MB12 and data bus DB4 transmitting data input and output to and from memory block 32 is not limited to the arrangement shown in FIG. 7 as long as they are arranged in any of the center regions CRL1 and CRL2 that divide the longer side of the semiconductor substrate into three. For example, memory block MB32 shown in FIG. 7 can be arranged in an horizontally reversed manner with data bus DB4 provided at center region CRL2.

By such arrangement of the data bus, data input and output of the semiconductor memory device having the memory block arrangement shown in FIG. 7 can be realized with the shortest path. For example, the data input or output to or from memory block MB11 is transmitted to the neighborhood of local control circuit LC11 by data bus DB1 to pass the neighborhood of local control circuit LC11 to the center pad PD.

FIG. 7 shows an example where the data buses are arranged along the direction of the shorter side of the chip. The data bus can be arranged in the direction of the longer side at the center region that divides the shorter side portion into three regions depending upon the structure of each memory block.

Figure 8:
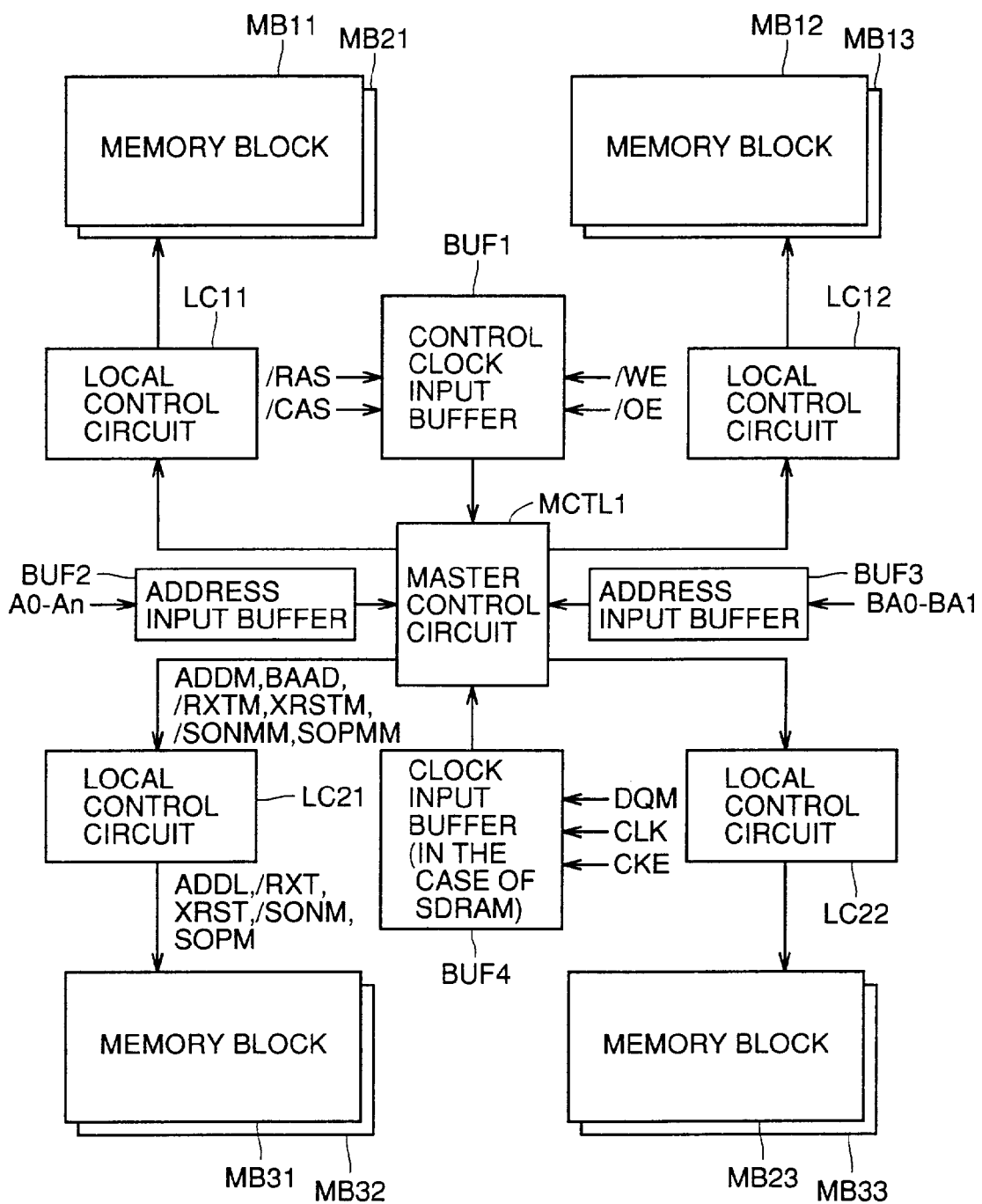
FIG. 8 is a block diagram showing a structure of the semiconductor memory device of the second embodiment.

FIG. 8 is a block diagram for describing a circuit structure of the semiconductor memory device of the second embodiment.

Referring to FIG. 8, the semiconductor memory device of the second embodiment includes a control clock input buffer BUF1 for receiving an external signal (/RAS, /CAS, /WE, /OE) for the control of the memory operation, an address input buffer BUF2 for receiving externally applied address signals A0–An, an address input buffer BUF3 for receiving externally applied bank addresses BA0–BA1, a clock input buffer BUF4 for receiving externally applied master clock CLK, clock enable signal CKE and output disable signal DQM, a master control circuit MCTL1 receiving an address signal from address input buffers BUF2, BUF3, a control signal from control clock input buffer BUF1, and a clock signal from clock input buffer BUF4, and local control circuits LC11, LC12, LC21 and LC22 for receiving a predecode signal ADDM, a bank address signal BAAD, timing signals /RXTM, XRSTM, and sense amplifier activation signals /SONMM, SOPMM generated from master control circuit MCTL1.

The local control circuit provides to a corresponding memory block an internal address signal ADDL, timing signals /RXT, XRST, and sense amplifier activation signals /SONM, SOPM for control. Local control circuit LC11 provides control of memory blocks MB11 and MB21. Local control circuit LC12 provides control of memory blocks MB12 and MB13. Local control circuit LC21 provides control of memory blocks MB31, MB32. Local control circuit LC22 provides control of memory blocks MB23 and MB33.

Figure 9:
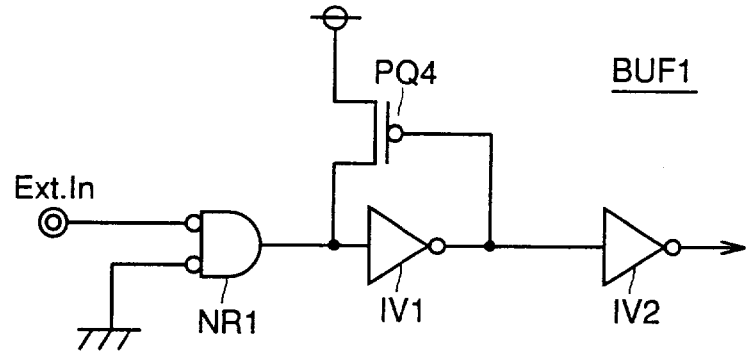
FIG. 9 is a circuit diagram showing the details of a structure of a control clock input buffer BUF1 of FIG. 1.

FIG. 9 is a circuit diagram showing the details of control clock input buffer BUF1 of FIG. 8.

Referring to FIG. 9, control clock buffer BUF1 includes a NOR circuit NR1 receiving an input signal Ext.In and ground potential, an inverter IV1 for receiving and inverting the output of NOR circuit NR1, a P channel transistor PQ4 receiving the output of inverter IV1 at its gate for coupling the input of inverter IV1 to the power supply potential, and an inverter IV2 for receiving the output of inverter IV1 at its gate and inverting the output to provide an output signal Int.In.

Row address strobe signal /RAS, column address strobe signal /CAS, write designation signal /WE, and output activation signal /OE are applied as input signal Ext.In described above to control clock input buffer BUF1.

Figure 10:
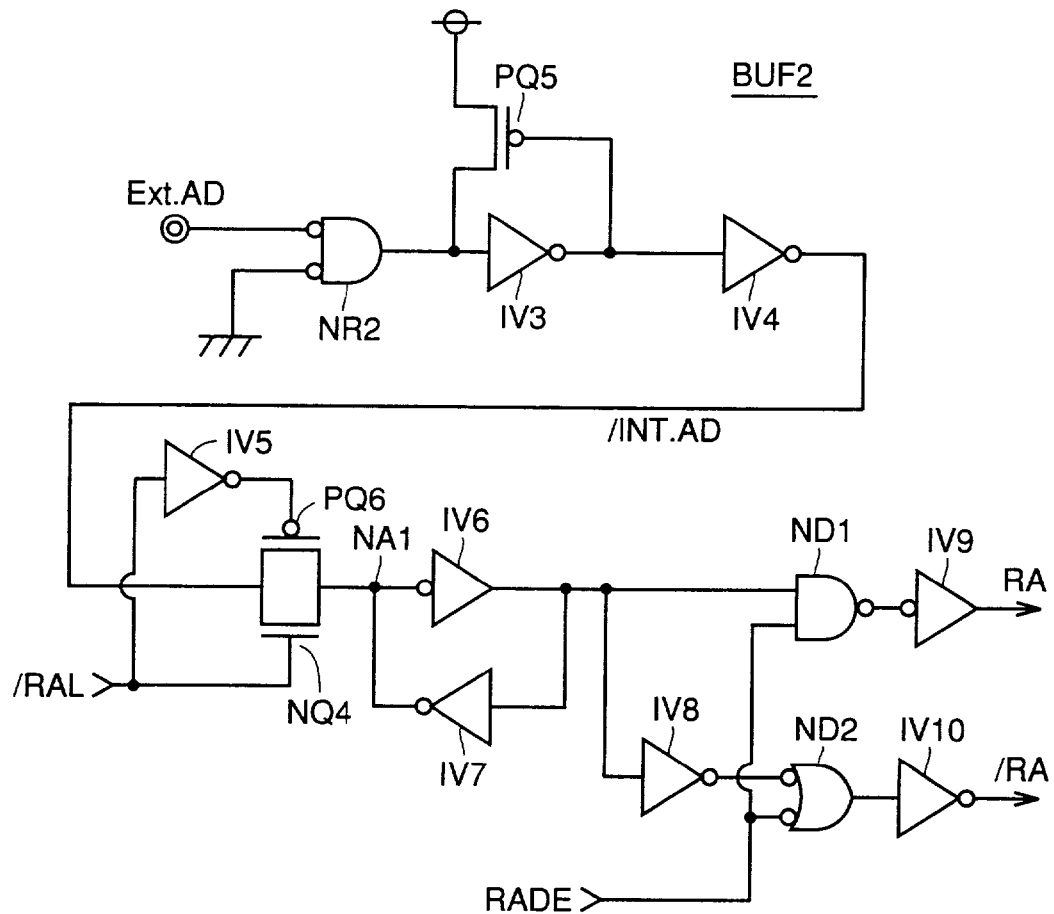
FIG. 10 is a circuit diagram showing the details of a structure of an address input buffer BUF2 of FIG. 8.

FIG. 10 is a circuit diagram showing the details of the structure of address input buffer BUF2.

Referring to FIG. 10, address input buffer BUF2 includes a NOR circuit NR2 for receiving an address input signal Ext.AD and ground potential, an inverter IV3 for receiving and inverting the output of NOR circuit NR2, a P channel transistor PQ5 receiving the output of inverter IV3 at its gate for coupling the input of inverter IV3 with the power supply potential, an inverter IV4 for receiving the output of inverter IV3 and inverting the same to output an internal address signal /Int.AD, an inverter IV5 for receiving and inverting an address receive signal /RAL, an N channel transistor NQ4 receiving address receive signal /RAL generated by master control circuit MCTL1 at its gate for transmitting internal address signal /Int.AD to node NA1, a P channel transistor PQ6 for receiving the output of inverter IV5 at its gate to transmit internal address signal /Int.AD to node NA1, an inverter IV6 having its input connected to node NA1, an inverter IV7 for receiving and inverting the output of inverter IV6 and feeding back the inverted signal to node NA1, a NAND circuit ND1 for receiving the output of inverter IV6 and address enable signal RADE, an inverter IV9 for receiving and inverting the output of NAND circuit ND1 to output address signal RA, an inverter IV8 for receiving and inverting the output of inverter IV6, a NAND circuit ND2 for receiving an output of inverter IV8 and address enable signal RADE generated by master control circuit MCTL1 that will be described afterwards, and inverter IV10 for receiving and inverting the output of NAND circuit ND2 to output an address inversion signal /RA.

Input signals A0–An are applied to address input buffer BUF2 shown in FIG. 10 as an address signal. Although not illustrated, address input buffer BUF3 receiving bank address signals BA0–BA1 has a similar structure.

Figure 11:
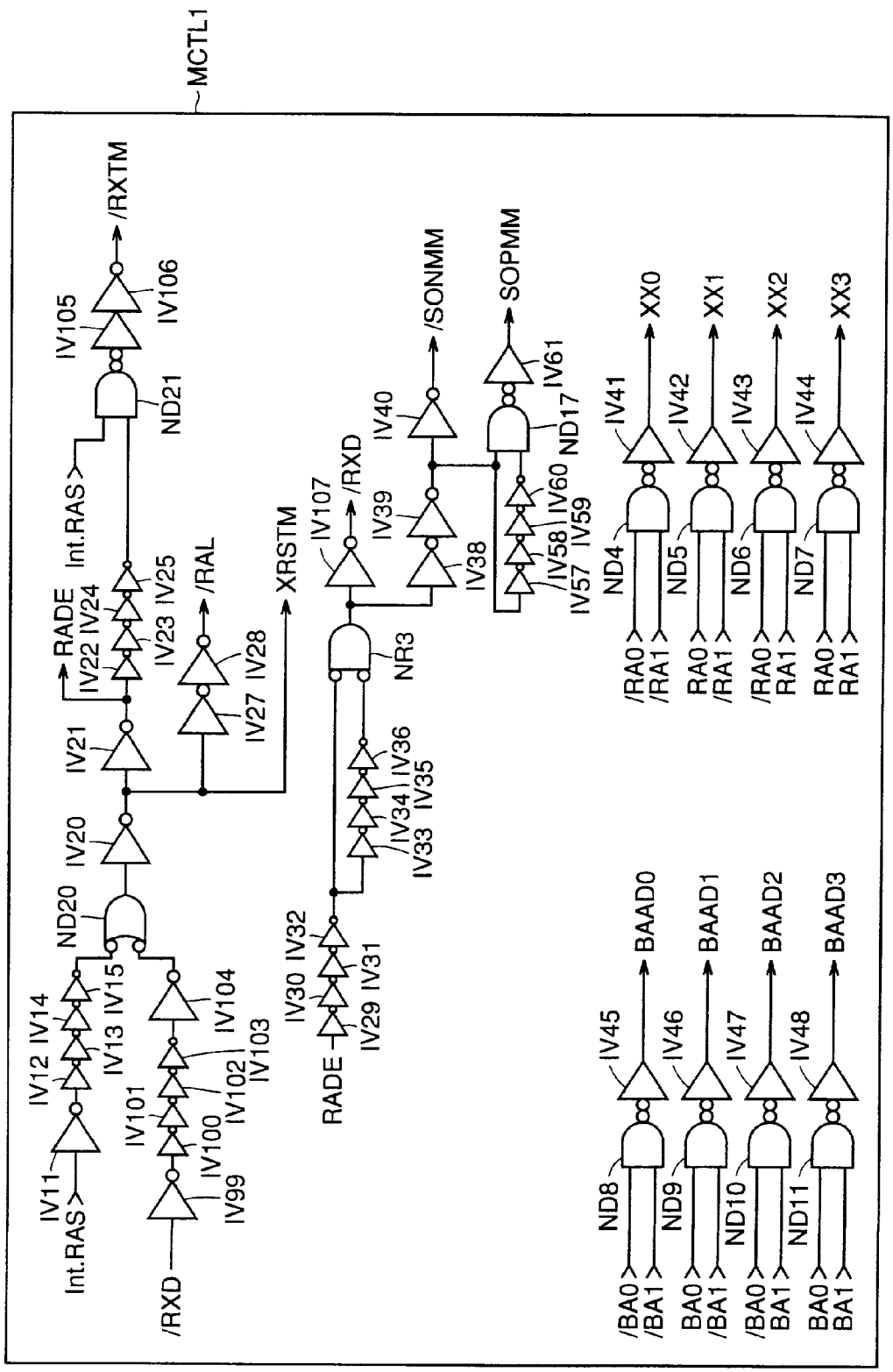
FIG. 11 is a circuit diagram showing the details of a structure of a master control circuit MCTL1 of FIG. 8.

FIG. 11 is a circuit diagram showing the details of the structure of master control circuit MCTL1 of FIG. 8.

Referring to FIG. 11, master control circuit MCTL1 includes an inverter IV11 receiving an internal row address strobe signal Int.RAS output from a control clock input buffer, inverters IV12, IV13, IV14 and IV15 connected in series for receiving and delaying the output of inverter IV11, inverters IV99–IV104 connected in series for receiving a timing signal /RXD that will be described afterwards, a NAND circuit ND20 for receiving outputs of inverters IV15 and IV104, an inverter IV20 for receiving and inverting the output of NAND circuit ND20 for providing a timing signal XRSTM, an inverter IV21 for receiving and inverting the output of inverter IV20 for providing address enable signal RADE, inverters IV22, IV23, IV24 and IV25 connected in series for receiving and delaying address enable signal RADE, a NAND circuit ND21 for receiving the output of inverter IV25 and internal row address strobe signal Int.RAS, inverters IV105 and IV106 connected in series for receiving the output of NAND circuit ND21 to provide timing signal /RXTM, and inverters IV27 and IV28 connected in series for receiving the output of inverter IV20 and providing address receive signal /RAL.

Master control circuit MCTL1 further includes inverters IV29, IV30, IV31 and IV32 connected in series for receiving and delaying address enable signal RADE, inverters IV33, IV34, IV35 and IV36 connected in series for receiving and delaying the output of inverter IV32, a NOR circuit NR3 for receiving the outputs of inverters IV32 and IV36, an inverter IV107 for receiving and inverting the output of NOR circuit NR3 to output timing signal /RXD, inverters IV38 and IV39 connected in series for receiving the output of NOR circuit NR3, an inverter IV40 for receiving and inverting the output of inverter IV39 for providing sense amplifier activation signal /SONMM, inverters IV57, IV58, IV59 and IV60 connected in series for receiving and delaying the output of inverter IV39, an NAND circuit ND17 for receiving the outputs of inverters IV39 and IV60, and an inverter 61 for receiving and inverting the output of NAND circuit ND17 to output sense amplifier activation signal SOPMM.

Master control circuit MCTL1 further includes a NAND circuit ND4 for receiving internal address signals /RA0 and /RA1, an inverter IV41 for receiving and inverting the output of NAND circuit ND4 to output a predecode signal XX0, a NAND circuit ND5 for receiving internal address signals RA0 and /RA1, an inverter IV42 for receiving and inverting the output of NAND circuit ND5 to output predecode signal XX1, a NAND circuit ND6 for receiving internal address signals /RA0 and RA1, an inverter IV43 for receiving and inverting the output of NAND circuit ND6 to output a predecode signal XX2, a NAND circuit ND7 for receiving internal address signals RA0 and RA1, and an inverter IV44 for receiving and inverting the output of NAND circuit ND7 to output a predecode signal XX3.

Predecode signals XX0, XX1, XX2 and XX3 correspond to predecode signal ADDM described with reference to FIG. 8.

Master control circuit MCTL1 further includes a NAND circuit ND8 for receiving bank address signals /BA0 and /BA1, an inverter IV45 for receiving and inverting the output of NAND circuit ND8 to output a bank select signal BAAD0, a NAND circuit ND9 for receiving bank address signals BA0 and /BA1, an inverter IV46 for receiving and inverting the output of NAND circuit ND9 to output a bank select signal BAAD1, a NAND circuit ND10 for receiving bank address signals /BA0 and BA1, an inverter IV47 for receiving and inverting the output of NAND circuit ND10 to output a bank select signal BAAD2, a NAND circuit ND11 for receiving bank address signals BA0 and BA1, and an inverter IV48 for receiving and inverting the output of NAND circuit ND11 to output a bank select signal BAAD3.

Figure 12:
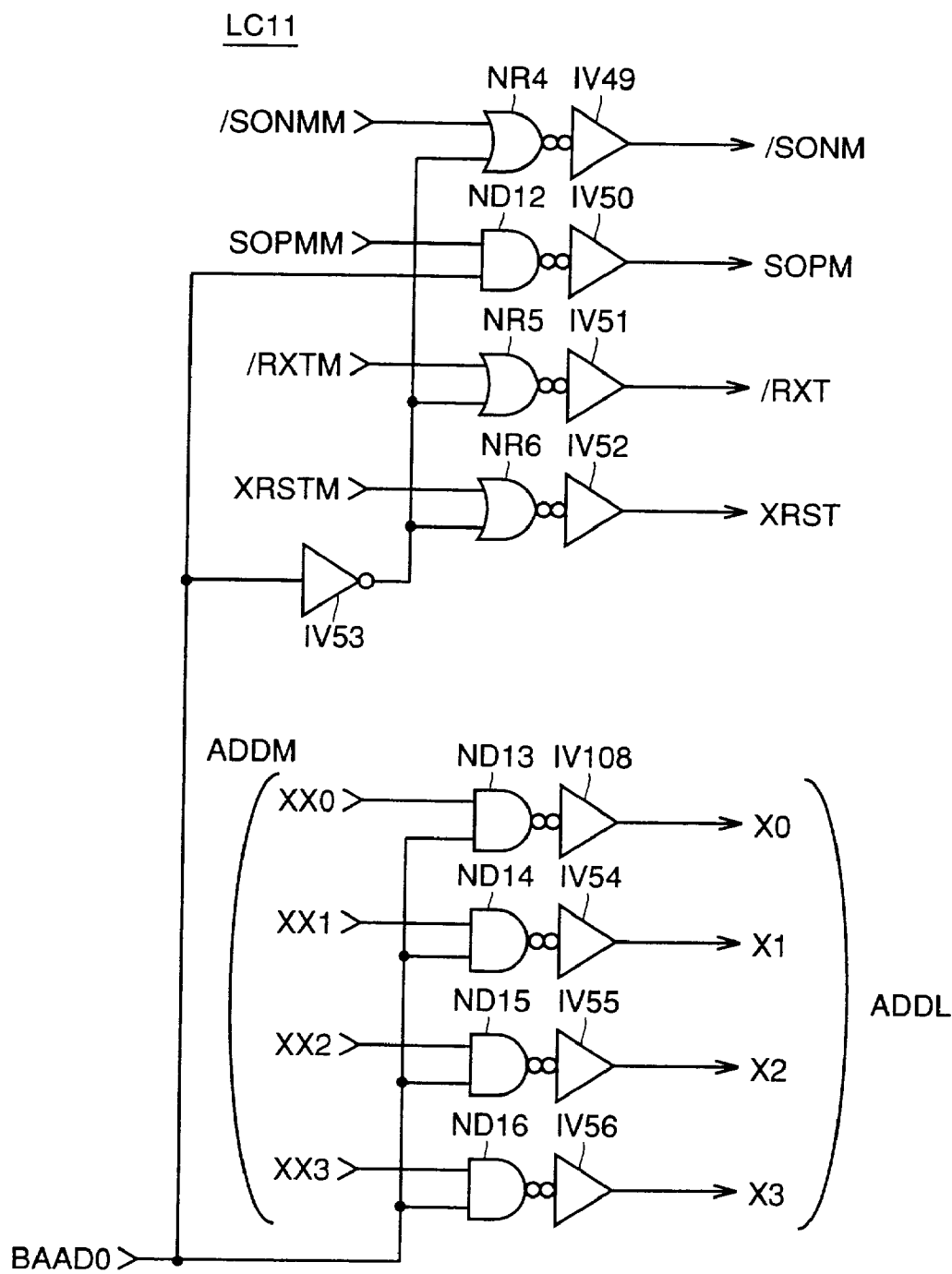
FIG. 12 is a circuit diagram showing the details of a structure of a local control circuit LC11 of FIG. 8.

FIG. 12 is a circuit diagram showing the details of the structure of local control circuit LC11 of FIG. 8.

Local control circuit LC11 includes an inverter IV53 for receiving and inverting a bank select signal BAADn, an NOR circuit NR4 for receiving the output of inverter IV53 and sense amplifier activation signal /SONMM, an inverter IV49 for receiving and inverting the output of NOR circuit NR4 to output sense amplifier activation signal /SONM, a NAND circuit ND12 for receiving sense amplifier activation signal SOPMM and the bank select signal BAA0, an inverter IV50 for receiving and inverting the output of NAND circuit ND12 to output sense amplifier activation signal SOPM, a NOR circuit NR5 for receiving timing signal /RXTM and the output of inverter IV53, an inverter IV51 for receiving and inverting the output of NOR circuit NR5 to output timing signal /RXT, a NOR circuit NR6 for receiving the output of inverter IV53 and timing signal XRSTM, and an inverter IV52 for receiving and inverting the output of NOR circuit NR6 to output timing signal XRST.

Local control circuit LC11 further includes a NAND circuit ND13 for receiving predecode signal XX0 and bank select signal BAAD0, an inverter IV108 for receiving and inverting the output of NAND circuit ND13 to output predecode signal X0, a NAND circuit ND14 for receiving predecode signal XX1 and band select signal BAAD0, an inverter IV54 for receiving and inverting the output of NAND circuit ND14 to output predecode signal X1, a NAND circuit ND15 for receiving predecode signal XX2 and bank select signal BAAD0, an inverter IV55 for receiving and inverting the output of NAND circuit ND15 to output predecode signal X2, a NAND circuit ND16 for receiving predecode signal XX3 and bank select signal BAAD0, and an inverter IV56 for receiving and inverting the output of NAND circuit ND16 to output predecode signal X3.

Predecode signals X0–X3 correspond to predecode signal ADDL shown in FIG. 8.

Local control circuits LC12, LC21 and LC22 have a structure similar to that of LC11 shown in FIG. 12.

The structure of the eight memory blocks of the semiconductor memory device of the second embodiment is similar to the structure of the first embodiment described with reference to FIGS. 2, 3 and 4. Therefore, description thereof will not be repeated.

Figure 13:
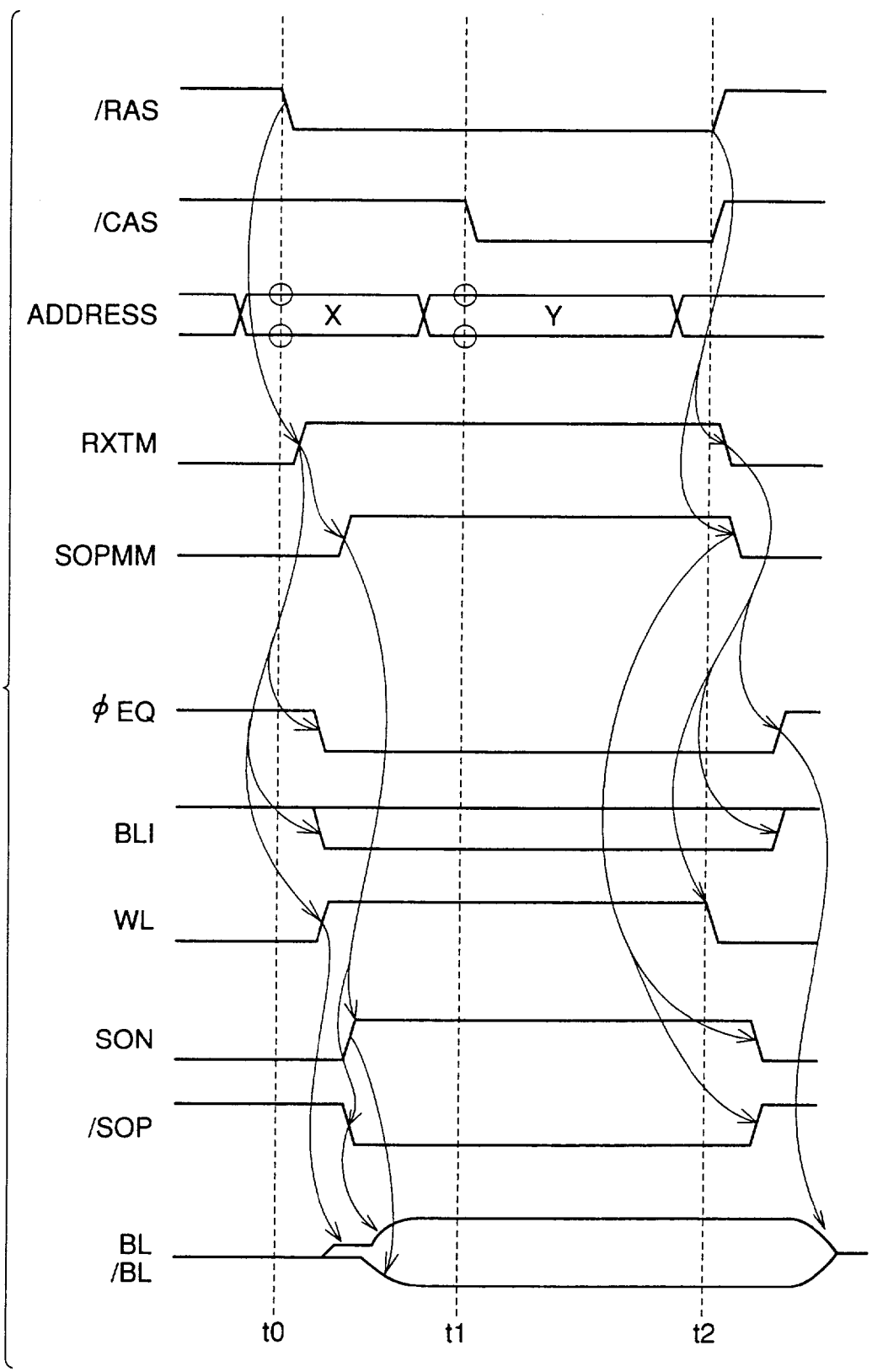
FIG. 13 is a waveform diagram for describing an operation of the semiconductor memory device of the second embodiment.

FIG. 13 is a waveform diagram for describing the operation of the semiconductor memory device of the second embodiment.

The state of word line WL0 of memory block MB#i being selected will be described with reference to FIGS. 3 and 13.

Prior to time t0, the semiconductor memory device of the second embodiment is in a standby state when row address strobe signal /RAS is at an H level.

Here, equalize designation signal φEQ is at an H level. All the equalize circuits EQ (EQa1, EQb0, EQb1) are active. Nodes Nx and Ny are precharged to a predetermined intermediate potential VBL.

Bit line isolation control signal BLI (BLIa0, BLIa1, and BLIb) is at an H level. Bit line isolation gate IG (IGca, IGaa1, IGab0, IGab2) is at an conductive state. Each bit line pair BLP (BLP0–BLP2) is electrically connected to nodes Nx and Ny via a corresponding bit line isolation gate, and precharged to the level of the predetermined intermediate potential VBL by equalize circuit EQ.

Sense amplifier activation signal /SOP is at an H level and sense amplifier activation signal SON is at an L level. P channel transistor PQ3 and N channel transistor NQ3 for activating the sense amplifier shown in FIG. 6 are at an nonconductive state. Sense amplifier SA is at an inactivation state. The signal on column select line CSL from the column decoder has a potential of an L level.

At time t0 when row address strobe signal /RAS is pulled down to an L level, a memory cycle is initiated.

In response to the fall of row address strobe signal /RAS, the currently applied address signal is received at the address buffer as an X address signal, whereby an internal address signal is generated. This internal address signal is predecoded by the master control circuit and the local control circuit to become an X address signal. This X address signal includes a block address signal for designating a memory block and a row address signal for designating a word line.

In response to designation of memory block MB#i, bit line equalize signal φEQ (φEQa and φEQb) for sense amplifier bands SB#i and SB#i+1 provided corresponding to memory block MB#i is driven to an L level. Therefore, equalize circuit EQ is rendered inactive, so that the precharge operation of bit line pair BLP in memory block MB#i is suppressed In response to the fall of row address strobe signal /RAS, signal RXTM which is an inverted version of timing signal /RXTM output from master control circuit MCTL1 is driven high.

Also, bit line isolation control signal BLIa0 is driven to an L level. Bit line isolation gate IGca is rendered nonconductive, whereby each bit line pair of memory block MB#i−1 is disconnected from sense amplifier band SB#i. Similarly, memory block MB#i+1 not shown is disconnected from sense amplifier band SB#i+1. At this stage, sense amplifier bands SB#i and SB#i+1 are connected to only memory block MB#i.

According to an X address signal, row decode circuit RD (refer to FIG. 4) carries out a decode operation. A signal designating a word line WL0 of memory block MB#i is generated. In response, word line driver WD0 drives word line WL0 to an H level. The remaining word lines WL1–WLn are at a non-selected state. The potential thereof are maintained at the L level.

In response to selection of word line WL0, transistor MT of memory cell MC connected to selected word line WL0 is rendered conductive, whereby the data stored in capacitor MC of each memory cell MC is read out onto a corresponding bit line BL. In FIG. 13, a waveform corresponding to data of an H level read out on a bit line BL or /BL is shown as an example. In bit line pair BLP, the bit line to which a selected memory cell is not connected maintains the intermediate potential VBL to supply the reference potential with respect to the memory cell data.

When the potential difference of the bit lines becomes sufficient, sense amplifier activation signals SON and /SOP are activated to attain an H level and an L level, respectively, according to sense amplifier activation signals /SONMM and SOPMM generated by the master control circuit.

In response, P channel transistor PQ3 and N channel transistor NQ3 shown in FIG. 6 are rendered conductive, whereby sense amplifier SA is activated. P channel transistors PQ1 and PQ2 operationally amplify the bit line potential transmitted on nodes Nx and Ny to drive the node (bit line) of the higher potential to the level of power supply potential Vcc. N channel transistors NQ1 and NQ2 drive the bit line of the lower potential of the bit line pair connected to node Nx and Ny to the level of ground voltage GND.

In parallel to this row select operation, column address strobe signal /CAS is pulled down to an active state of an L level at time t1, whereby a column select operation is initiated. In response to the fall of column address strobe signal /CAS, the currently applied address signal is received as an Y address signal. Column decoder /CD carries out a decode operation, whereby column select signal transmission line CSL corresponding to the addressed column is driven to a selected state (H level).

Then, data writing/reading is carried out with respect to the memory cell provided at the crossing of addressed word line WL0 and column select signal transmission line CSL. Data is read out in response to the fall of column address strobe signal /CAS. Data is written in response to column address strobe signal /CAS and write enable signal /WE indicating data writing both attaining an active state.

At time t2, row address strobe signal /RAS and column address strobe signal /CAS attain an inactive state of an H level. Thus, a memory cycle is completed.

In response to the rise of row address strobe signal /RAS, timing signal RXTM output from the master control circuit and sense amplifier activation signal SOPMM are pulled down. In response, the potential of selected word line WL0 is driven to an L level.

Then, sense amplifier activation signals SOP and SON are rendered inactive. All bit line isolation control signals BLI attain an H level. Then, equalize designation signal φEQ attains an H level. The bit lines of memory blocks MB#i, MB#i−1 and MB#i+1 are precharged again to intermediate potential VBL by the bit line equalize circuit.

In response to a rise of column address strobe signal /CAS, the column decoder is rendered inactive. The potential of column select signal transmission line CSL at a selected state is pulled down to an L level.

When the capacity of the memory and the chip size are small, the semiconductor memory device can be controlled even if the control circuit is not divided into a master control circuit and a local control circuit. However, when the capacity of the memory is increased and the chip size per se becomes larger, the path length of the signal from the control circuit to a memory block becomes longer to increase the load on the driver of the control circuit. As a result, delay will become noticeable.

In the semiconductor memory device of the second embodiment, the control circuit is divided into a master control circuit and local control circuits. The local control circuits for controlling each memory block is arranged at the four corners of the center region at the second row and second column receiving a control signal from the master control circuit. By this arrangement of the local control circuits, all the memory blocks have at least one corner located in close proximity to any one local central circuit. Therefore, delay of a control signal for all the eight memory blocks becomes equal. Thus, equal control for each memory block can be realized.

Third Embodiment

Figure 14:
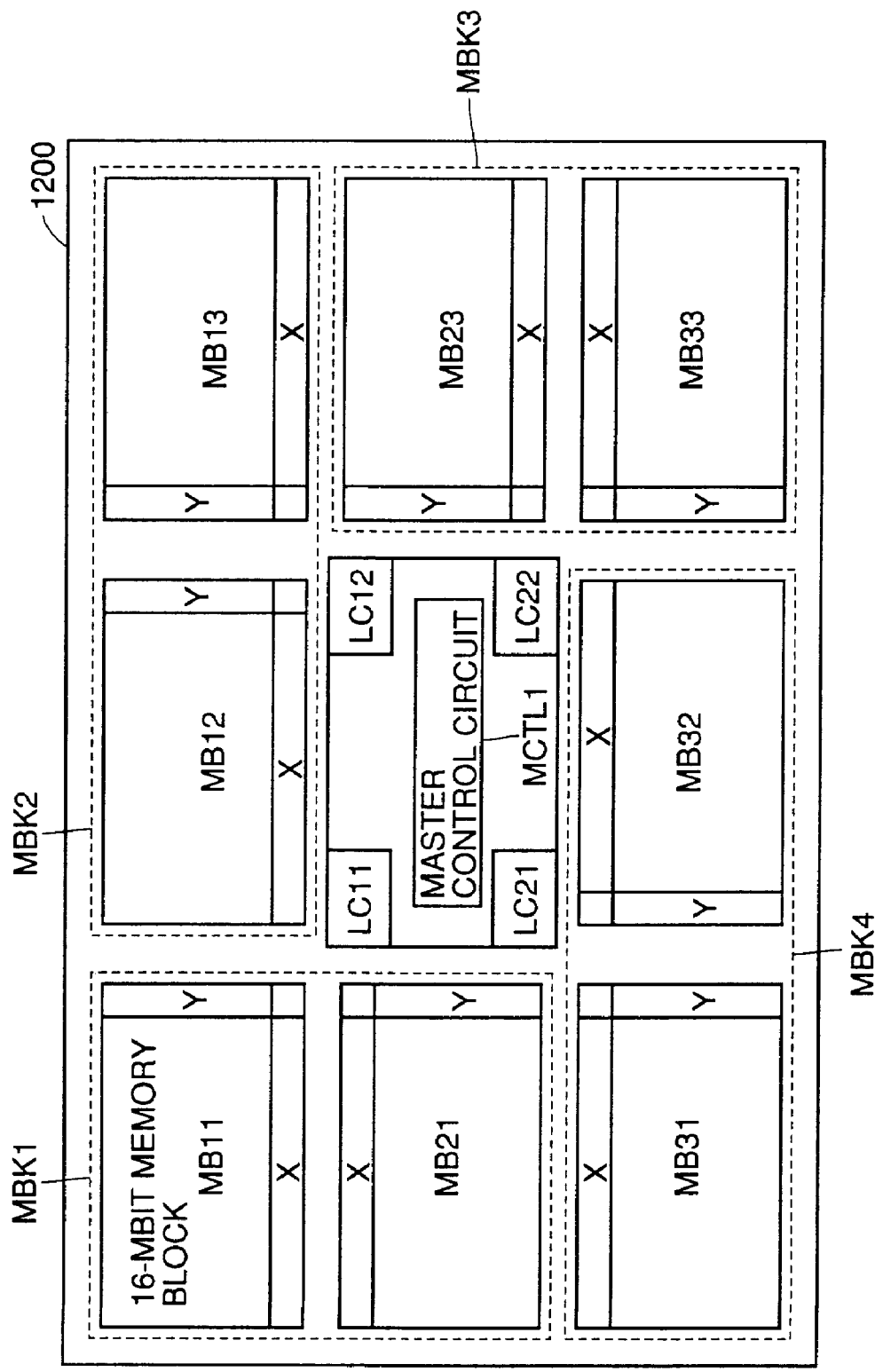
FIG. 14 shows a structure of a semiconductor memory device according to a third embodiment of the present invention.

FIG. 14 is a diagram for describing a structure of a semiconductor memory device according to a third embodiment of the present invention.

Referring to FIG. 14, the semiconductor memory device of the third embodiment includes a memory bank MBK1 including memory blocks MB11 and MB21, a memory bank MBK2 including memory blocks MB12 and MB13, a memory bank MBK3 including memory blocks MB23 and MB33, and a memory bank MBK4 including memory blocks MB31 and MB32.

Memory bank MBK1 is under control of local control circuit LC11. Memory bank MBK2 is under control of local control circuit LC12. Memory bank MBK3 is under control of local control circuit LC22. Memory bank MBK4 is under control of local control circuit LC21. A read related circuit and a write related circuit that are operable independently are provided corresponding to each bank.

Therefore, independent control can be provided for memory banks MBK1–MBK4. Since the signal delay and skew from the master control circuit can be made substantially equal with respect to each bank, a DRAM of a faster operation can be realized.

This bank structure is employed particularly in a clock synchronous type DRAM (synchronous DRAM: SDRAM).

Figure 15:
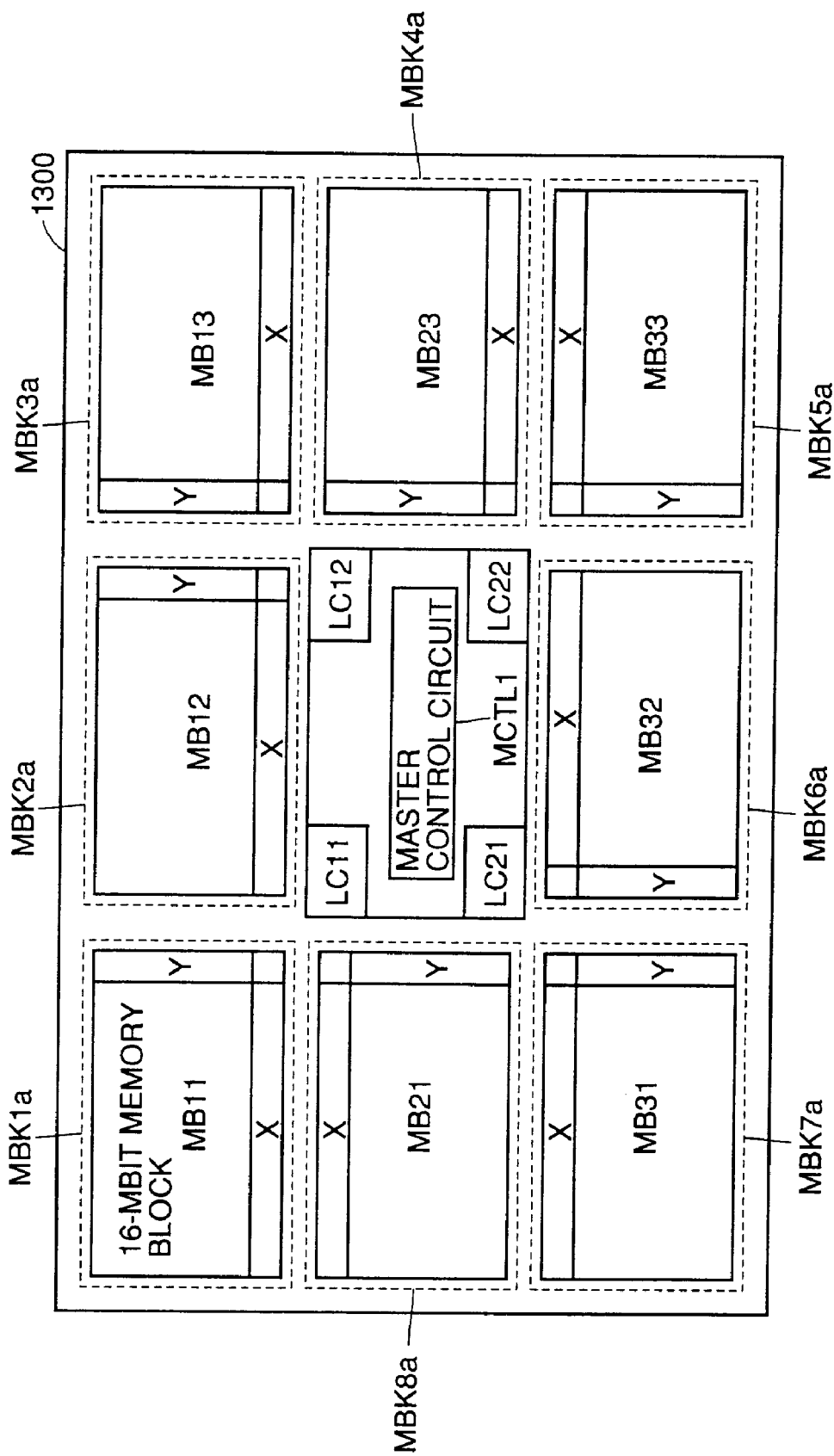
FIG. 15 shows a modification of the semiconductor memory device of the third embodiment.

Since each of the eight memory blocks has an independent row decoder RRC to be operable individually, the respective memory blocks shown in FIG. 15 can readily be allocated to the eight banks of MBK1a–MBK8a.

Fourth Embodiment

Figure 16:
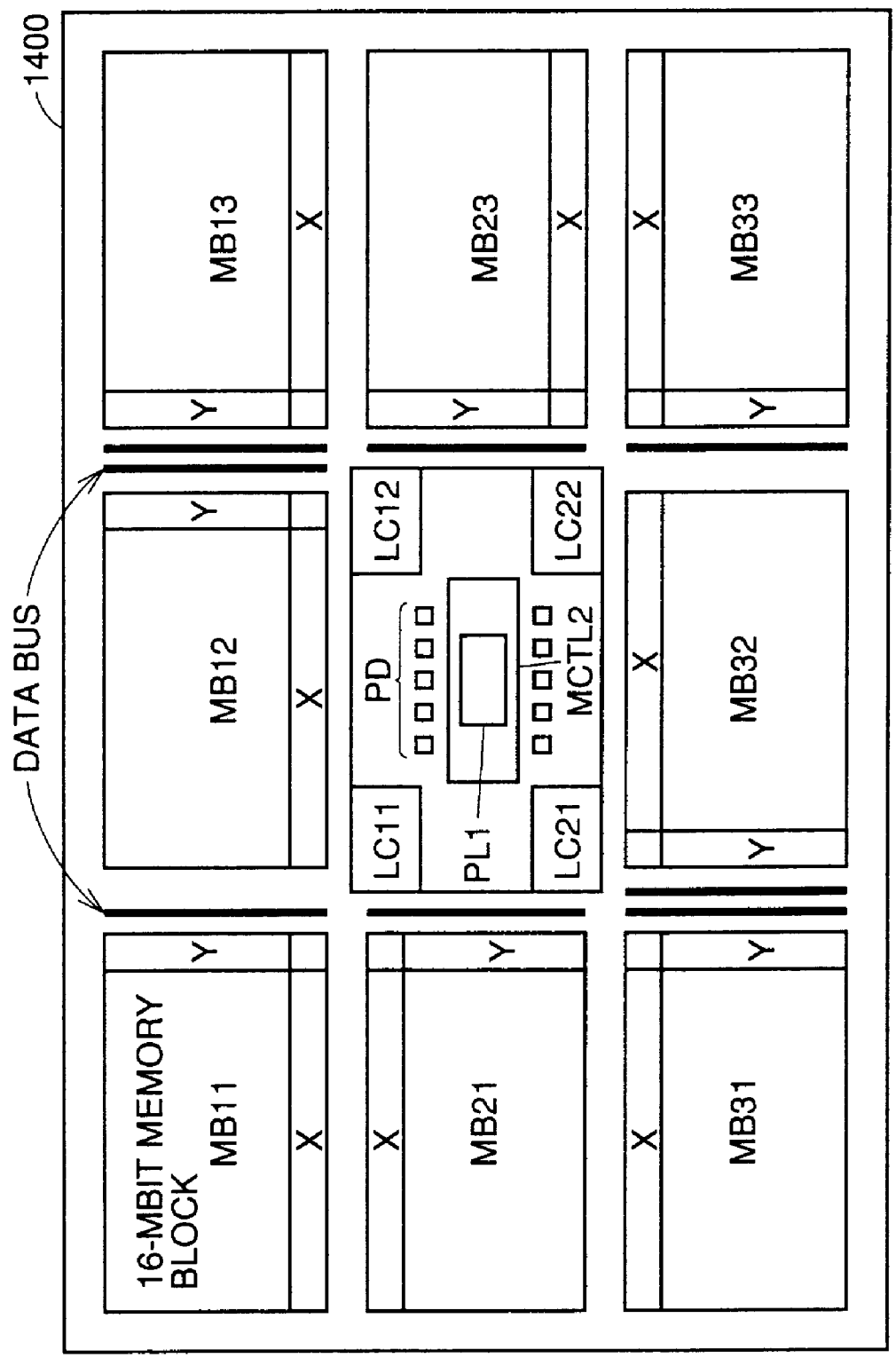
FIG. 16 shows an arrangement of a semiconductor memory device according to a fourth embodiment.

FIG. 16 shows a structure of a semiconductor memory device according to a fourth embodiment of the present invention.

The semiconductor memory device of the fourth embodiment has a structure similar to that of the semiconductor memory device of the second embodiment, provided that a master control circuit MCTL2 is included instead of master control circuit MCTL1. Also, there is difference in that master control circuit MCTL2 includes a phase locked loop circuit PL1 at the center. The remaining structure is similar to that of the second embodiment, so that description thereof will not be repeated.

Figure 17:
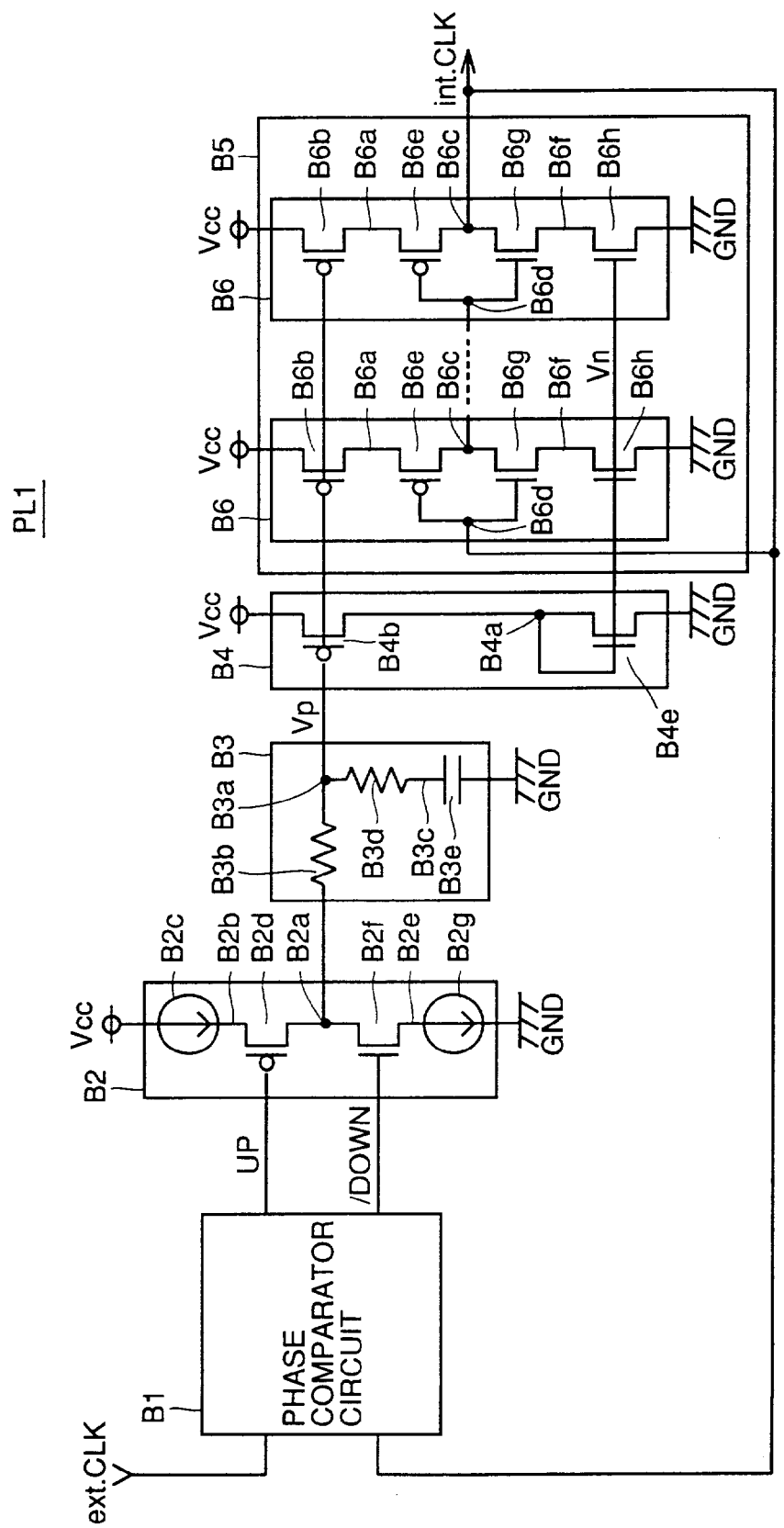
FIG. 17 is a circuit diagram showing a structure of a PLL circuit PL1 of FIG. 16.

FIG. 17 is a circuit diagram of phase locked loop circuit PL1 of FIG. 16.

Referring to FIG. 17, phase locked loop circuit PL1 includes a phase comparator circuit B1 for comparing an external clock signal ext.CLK with an internal clock signal int.CLK generated by phase locked loop circuit PL1 to output control signals UP and /DOWN according to offset in these phases, a charge pump circuit B2 for supplying or drawing out charge to or from node B2a according to control signals UP and /DOWN output from phase comparator circuit B1, a loop filter B3 for providing an output potential Vp according to transition of output node B2a of charge pump circuit B2, a current adjustment potential output circuit B4 for receiving output potential Vp of loop filter B3 to provide an output potential Vn according to output potential Vp, and a ring oscillator B5 receiving output potential Vp and output potential Vn to generate an internal clock signal int.CLK of a corresponding frequency.

Charge pump circuit B2 includes a constant current circuit B2c for conducting a constant current between the power supply node to which power supply potential Vcc is supplied and node B2b, a P channel transistor B2d receiving control signal UP at its gate and connecting node B2b and node B2a, an N channel transistor B2f receiving control signal /DOWN at its gate and connecting node B2a and B2e, and a constant current circuit B2g for conducting a constant current from node B2e to ground potential GND.

Loop filter B3 includes a resistor B3b connecting nodes B2a and B3a, a resistor B3d connecting nodes B3a and B3c, and a capacitor B3e connected between node B3c and the ground potential.

Node B3a attains the output potential Vp from loop filter B3.

Current adjustment potential output circuit B4 includes a P channel transistor B4b receiving output potential Vp at its gate and connecting power supply potential Vcc and node B4a, and an N channel transistor B4e having a gate and drain connected to node B4a and a source coupled to the ground potential. The potential of node B4a is the output potential Vn.

Ring oscillator B5 includes an odd number of inverters B6 connected in series, having the output of the last stage connected to the input of the first stage.

Inverter B6 includes a P channel transistor B6b having a gate receiving output voltage Vp, a source connected to power supply potential Vcc, and a drain connected to a node B6a for limiting the current flow from the power supply node to which power supply potential Vcc is applied according to output voltage Vp, an N channel transistor B6h having a gate receiving output potential Vn, a drain connected to node B6f, and a source coupled to ground potential GND for limiting the current flow from node B6f to ground potential GND according to output voltage Vn, a P channel transistor B6e having a gate receiving the potential of node B6d, a source connected to node B6a, and a drain connected to output node B6c, and an N channel transistor B6g having a gate receiving the potential of node B6d, a source connected to node B6f, and a drain connected to node B6c.

Figure 18:
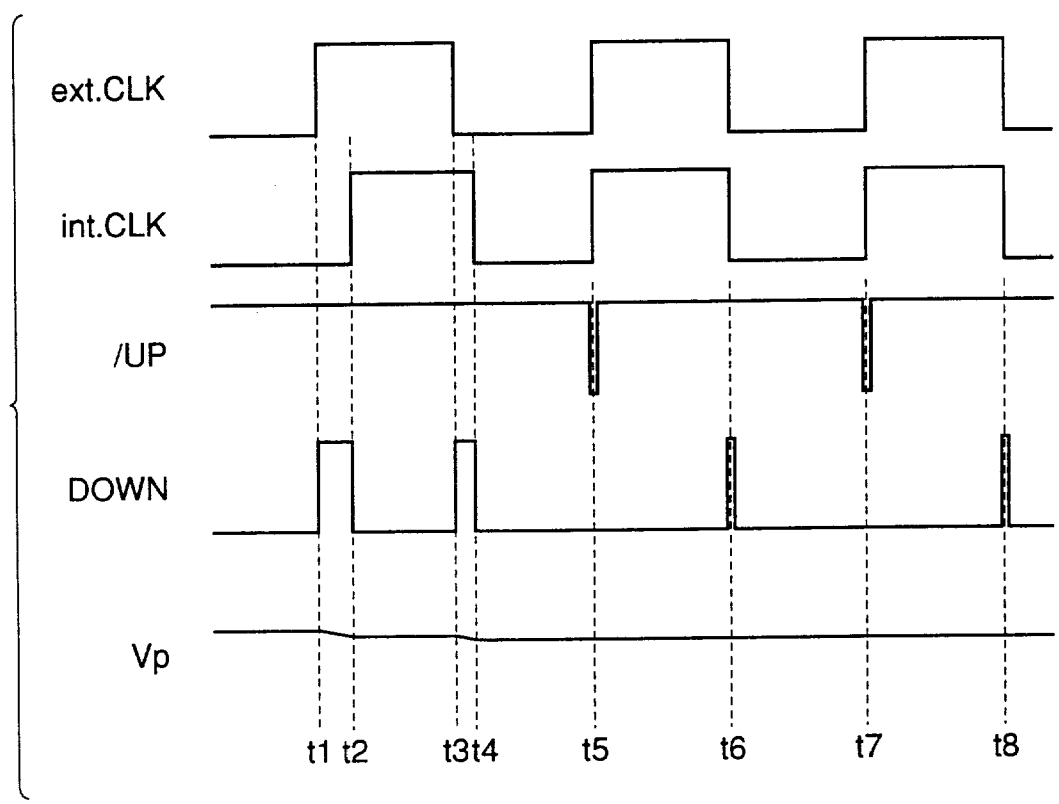
FIG. 18 is a waveform diagram for describing an operation of PLL circuit PL1 of FIG. 17.

FIG. 18 is a waveform diagram for describing an operation of phase locked loop circuit PL1 of FIG. 17.

Referring to FIGS. 17 and 18, external clock signal ext.CLK applied to the pad at the center region of the chip is pulled up prior to internal clock signal int.CLK at time t1. Therefore, phase comparator circuit B1 drives control signal DOWN to an H level from an L level.

In response to the rise of internal clock signal int.CLK to an H level from an L level at time t2, control signal DOWN output from phase comparator circuit B1 is pulled down to an L level.

Accordingly, output potential Vp of the loop filter shows a fall in potential from time t1 to time t2 since charge is drawn out from node B3a according to the pulse width of control signal DOWN.

At time t3, external clock signal ext.CLK is pulled down prior to internal clock signal int.CLK, whereby control signal DOWN output from phase comparator circuit B1 is pulled up to an H level.

At time t4, the fall of internal clock signal int.CLK to an L level causes the transition of control signal DOWN to an L level.

At time t3–t4, output potential Vp is further reduced according to the pulse width of control signal DOWN. Accordingly, the oscillating frequency of the ring oscillator is reduced. At time t5–t8, external clock signal ext.CLK and internal clock signal int.CLK have substantially the same frequency and phase, whereby the phase locked loop is locked-in.

This phase locked loop (PLL) circuit is often used in a SDRAM that operates at a speed higher than the clock frequency of 100 MHz.

When an external clock signal applied through a clock terminal is amplified by a buffer in a semiconductor memory device to be used as an internal clock signal, the internal clock signal will include delay with respect to the external clock signal due to the delay by the buffer. This delay narrows the operation margin in a SDRAM that carries out data transfer at high speed with an external source.

By arranging a PLL circuit generating an internal clock signal at the center region of a semiconductor memory device as shown in FIG. 16, the phase offset and skew of an internal clock signal received by the control circuitry of the eight memory blocks can be reduced. Thus, a stable control of higher speed can be realized.

Fifth Embodiment

Figure 19:
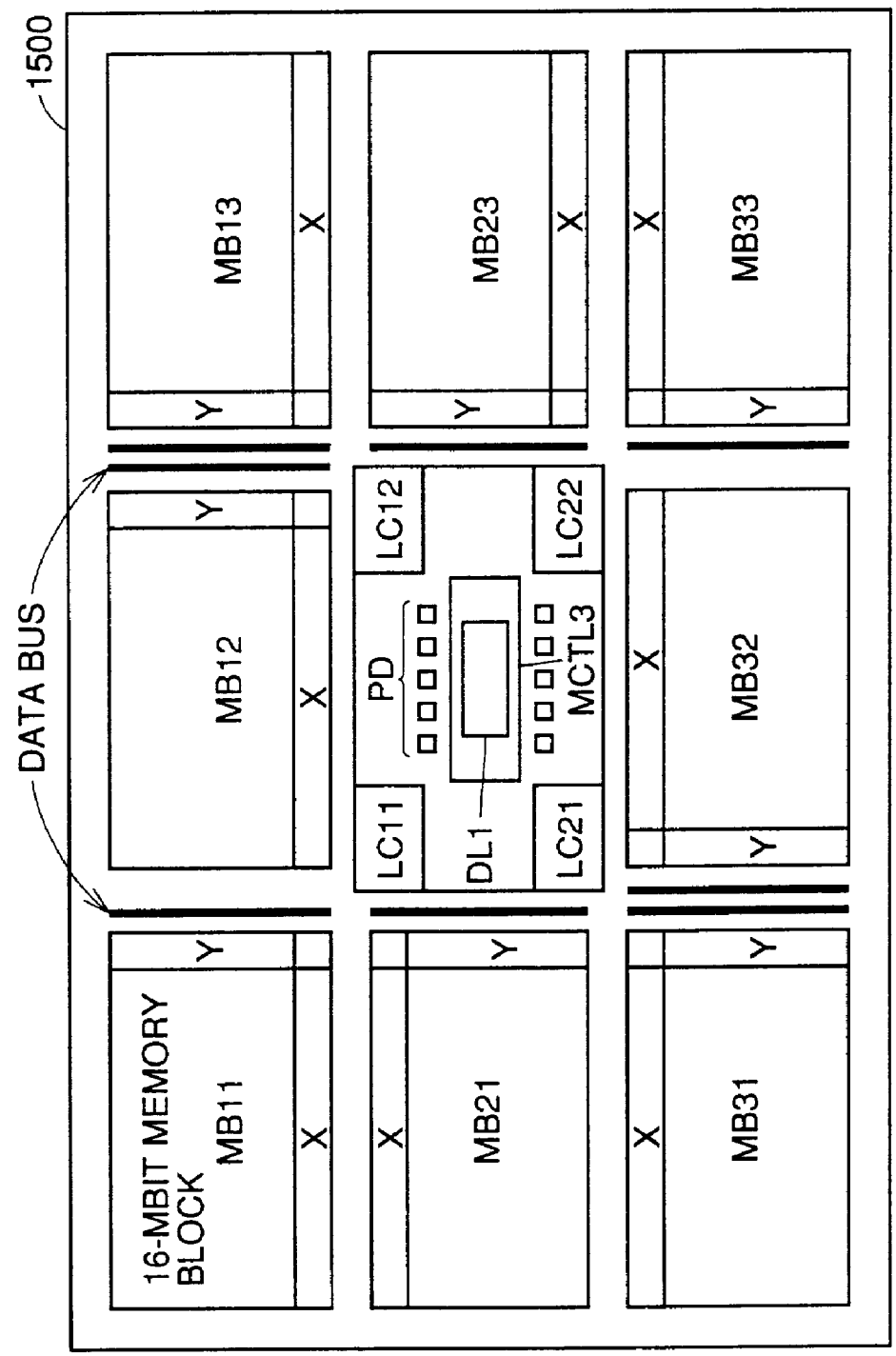
FIG. 19 shows an arrangement of a semiconductor memory device according to a fifth embodiment.

FIG. 19 is a diagram for describing a structure of a semiconductor memory device according to a fifth embodiment of the present invention.

The semiconductor memory device of the fifth embodiment shown in FIG. 19 has a structure similar to that of the semiconductor memory device of the second embodiment, provided that, instead of master control circuit MCTL1, a master control circuit MCTL3 is provided which has a delay locked loop circuit DL1 at the center region. The remaining structure is similar to that of the semiconductor memory device of the second embodiment. Therefore, description thereof will not be repeated.

Figure 20:
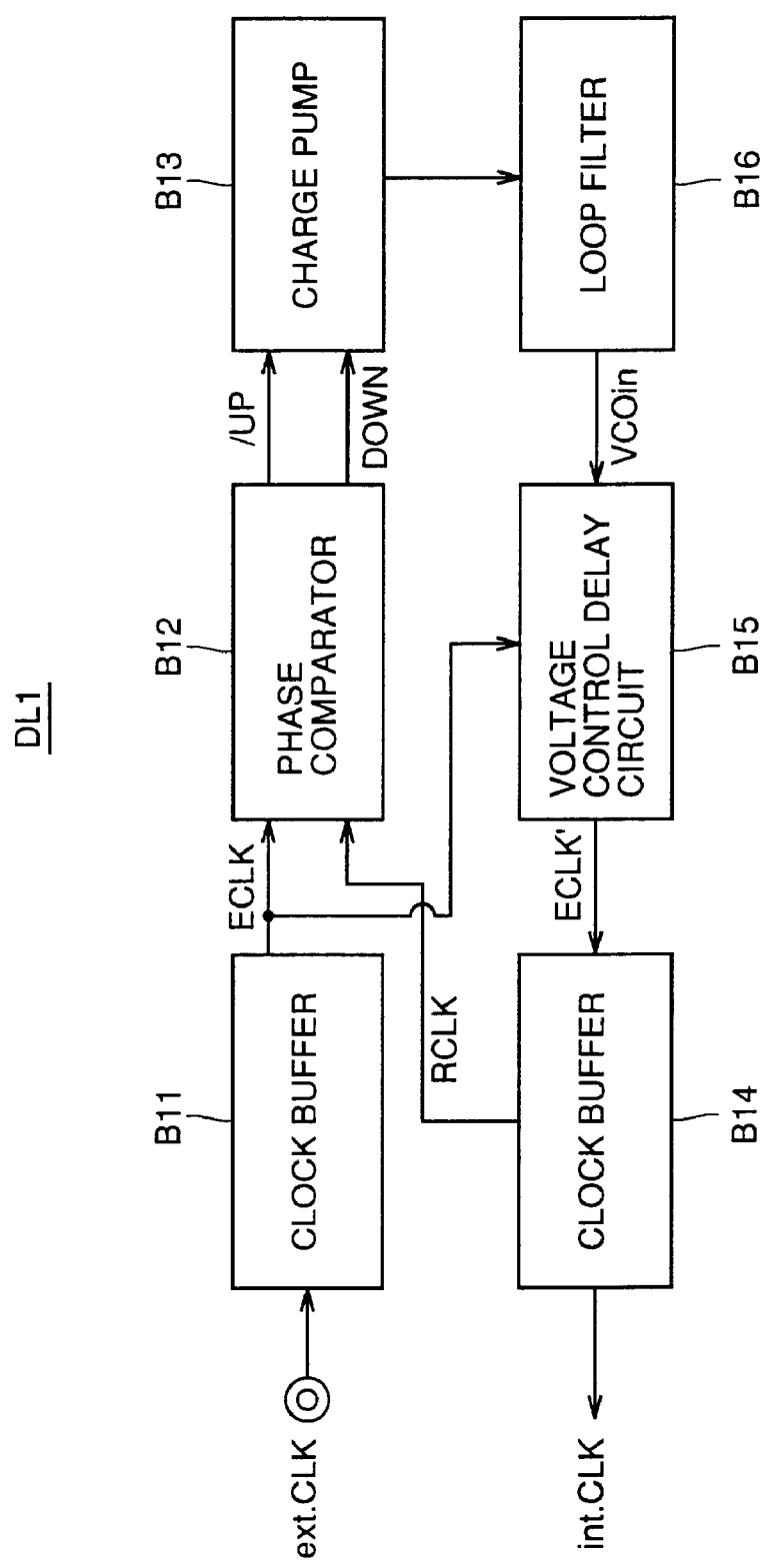
FIG. 20 is a block diagram showing a structure of a DLL circuit DL1 of FIG. 19.

FIG. 20 is a block diagram showing a structure of the DLL circuit of FIG. 19.

Referring to FIG. 20, DLL circuit DL1 includes a clock buffer B11 for receiving external clock signal ext.CLK applied to the pad at the center area of the chip, a phase comparator B12 for comparing a clock signal ECLK output from clock buffer B11 with an intermediate clock signal RCLK to output a control signal /UP and DOWN according to the phase difference, a charge pump B13 for receiving control signals /UP and DOWN, a loop filter B16 receiving the output of charge pump B13 to output a control voltage VCOin, a voltage control delay circuit B15 receiving clock signal ECLK output from clock buffer B11 to delay the same according to control voltage VCOin to output a delay clock ECLK', and a clock buffer B14 receiving delay clock ECLK' to output intermediate clock signal RCLK and internal clock signal int.CLK.

Figure 21:
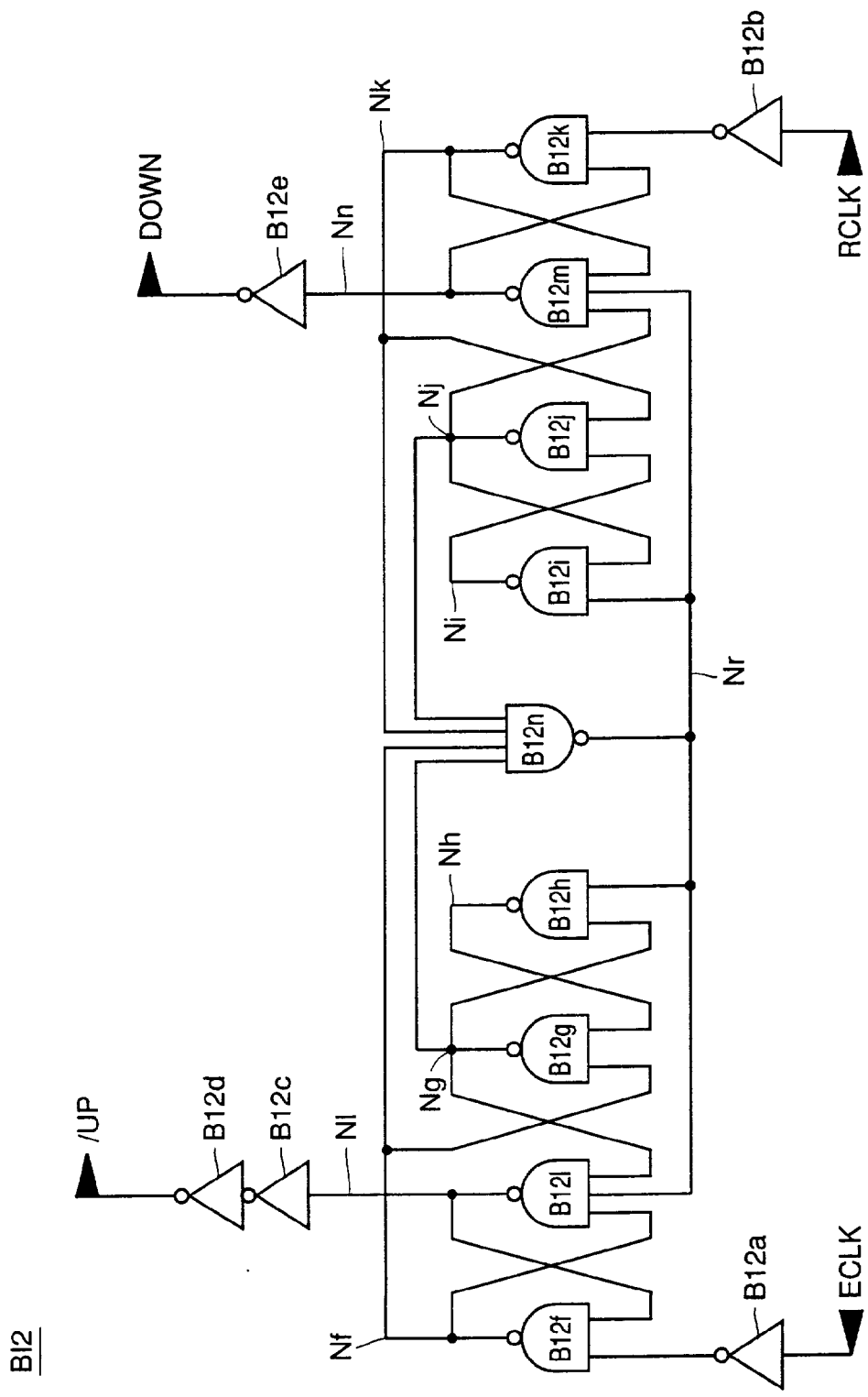
FIG. 21 is a circuit diagram showing a structure of a phase comparator B12 of FIG. 20.

FIG. 21 is a circuit diagram showing a structure of phase comparator B12.

Referring to FIG. 21, phase comparator B12 includes an inverter B12a for receiving and inverting clock signal ECLK, a NAND circuit B12f receiving the output of inverter B12a and the potential of node N1, and having the output connected to node Nf, a NAND circuit B12l having the input connected to nodes Nf, Nr and Ng, and its output connected to node N1, a NAND circuit B12g having inputs connected to nodes Nf and Nh and an output connected to node Ng, a NAND circuit B12h having inputs connected to nodes Ng and Nr and an output connected to node Nh, and inverters B12c and B12d connected in series, having the input connected to node N1 for providing control signal /UP.

Phase comparator B12 further includes an inverter B12b for receiving intermediate clock signal RCLK, an NAND circuit B12k for receiving the output of inverter B12b and the potential of node Nn, and having its output connected to node Nk, a NAND circuit B12m having inputs connected to nodes Nj, Nr and Nk, and an output connected to node Nn, a NAND circuit B12j having inputs connected to nodes Ni and Nk, and an output connected to node Nj, a NAND circuit B12i having inputs connected to nodes Nr and Nj, and its output connected to node Ni, a NAND circuit B12n having inputs connected to nodes Ng, Nf, Nk and Nj, and its output connected to node Nr, and an inverter B12e having an input connected to node Nn to output a control signal DOWN.

Figure 22:
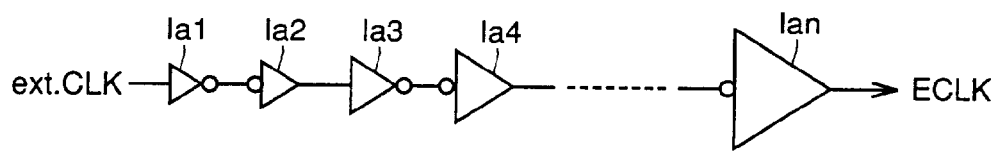
FIG. 22 is a circuit diagram showing a structure of a clock buffer B11 of FIG. 20.

FIG. 22 is a circuit diagram showing a structure of clock buffer B11.

Referring to FIG. 22, clock buffer B11 includes m (m is a natural number) inverters Ia1–Iam connected in series for amplifying external clock signal ext.CLK to output clock signal ECLK. The size of the symbol of inverters Ia1–Iam represents the level of the load driving capability of each inverter. The load driving capability of an inverter gradually increases towards the output stage. The number of stages M of inverters Ia1–Iam is set according to the input capacitance of phase comparator B12 and voltage delay circuit B15.

Figure 23:
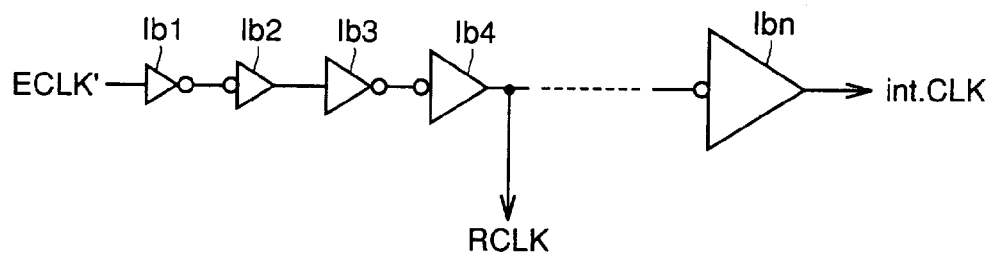
FIG. 23 is a circuit diagram showing a structure of a clock buffer B14 of FIG. 20.

FIG. 23 is a circuit diagram showing a structure of clock buffer B14.

Clock buffer B14 includes n (n is a natural number) inverters Ib1–Ibn connected in series for amplifying delay clock ECLK' output from the voltage control delay circuit to output internal clock signal int.CLK and intermediate clock signal RCLK. Internal clock signal int.CLK is supplied to the control circuitry providing control of each memory block.

The load driving capability of inverters Ib1–Ibn forming clock buffer B14 gradually increases towards the output stage, similar to clock buffer B11.

The number of stages n of inverters Ib1–Ibn is set according to the level of the load capacitance. The inverter that provides intermediate clock signal RCLK (inverter Ib4 in the drawing) is selected so that the phase difference between external clock signal ext.CLK and internal clock signal int.CLK is a predetermined value.

Figure 24:
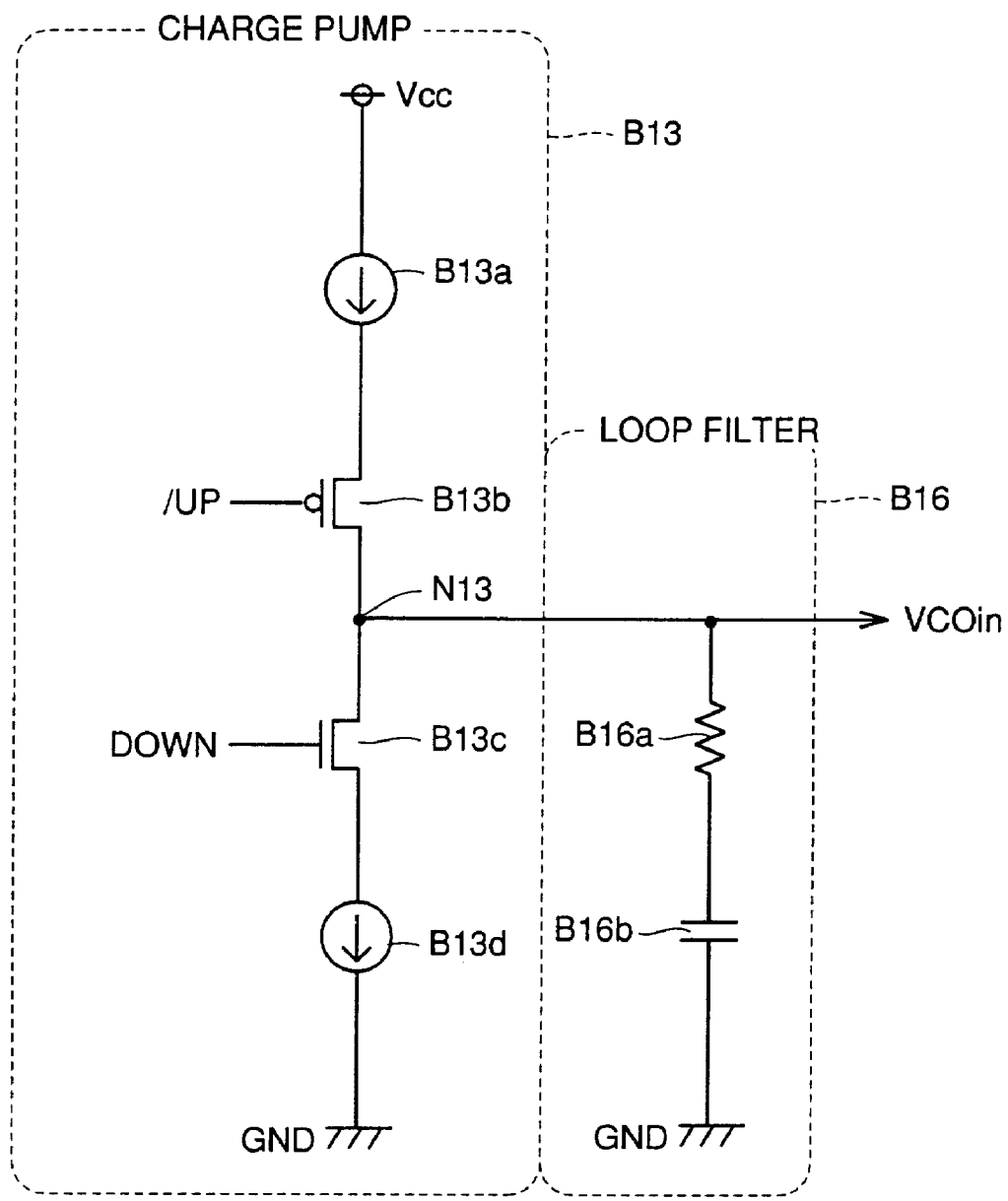
FIG. 24 is a circuit diagram showing a structure of a charge pump B13 and a loop filter B16 of FIG. 20.

FIG. 24 is a circuit diagram showing a structure of charge pump B13 and loop filter B16 of FIG. 20.

Referring to FIG. 24, charge pump B13 includes a constant current source B13a, a P channel transistor B13b, an N channel transistor B13c and a constant current source B13d connected in series between the power supply node to which power supply potential Vcc is supplied and the ground node.

P channel transistor B13b receives control signal /UP at its gate. N channel transistor B13c receives control signal DOWN at its gate. The connection node N13 of P channel transistor B13b and N channel transistor B13c is the output node of charge pump B13. Loop filter B16 includes a resistor B16a and a capacitor B16b connected in series between output node N13 of charge pump B13 and the ground node.

Figure 25:
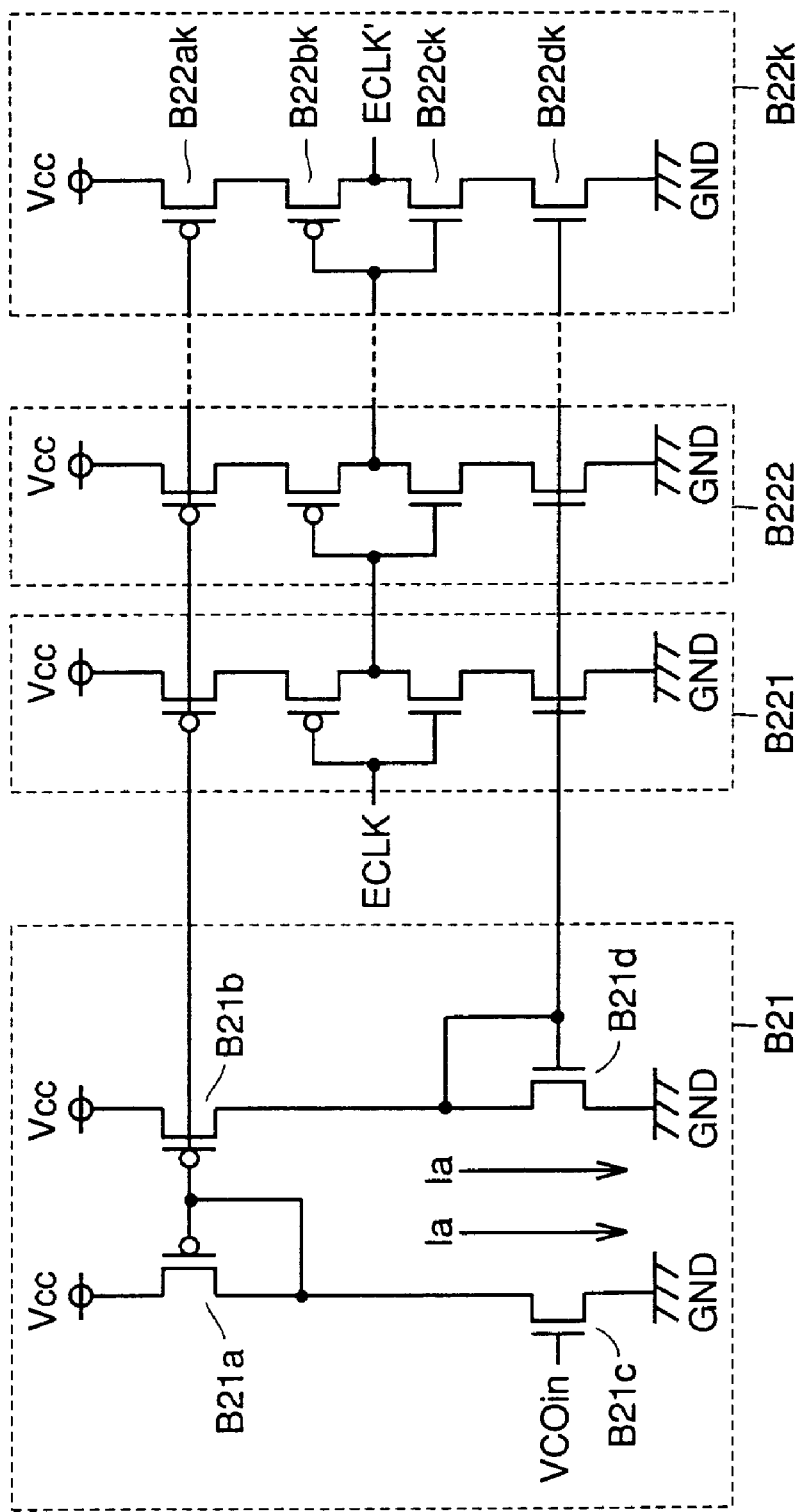
FIG. 25 is a circuit diagram showing a structure of a voltage control delay circuit B15 of FIG. 20.

FIG. 25 is a circuit diagram showing a structure of voltage delay circuit B15 of FIG. 20.

Referring to FIG. 25, voltage control delay circuit B15 includes a bias generation circuit B21, and k (k is a natural number) variable delay time inverters B221–B22k connected in series.

Bias voltage generation circuit B21 includes an N channel transistor B21c having a gate receiving control voltage VCOin and a source coupled to the ground potential, a P channel transistor B21a having a gate and drain connected to the drain of N channel transistor B21c and a source coupled to power supply potential Vcc, a P channel transistor B21b having a gate receiving the potential of the drain of N channel transistor B21c and a source coupled to power supply potential Vcc, and an N channel transistor B21d having a drain and gate connected to P channel transistor B21b and a source connected to the ground potential.

The potential of the drain of N channel transistor B21c attains control potential Vp1. The potential of the drain of P channel transistor B21b attains control potential Vn.

Variable delay time inverter B22k (k is a natural number) includes a P channel transistor B22ak receiving a control potential Vp1 at its gate for limiting the current from the power supply node to which power supply potential Vcc is applied, an N channel transistor B22dk receiving control potential Vn at its gate for limiting the current flowing to the ground node, and a P channel transistor B22bk and an N channel transistor B22ck connected in series between the drain of P channel transistor B22ak and the drain of N channel transistor B22dk.

P channel transistor B22bk has its gate connected to the gate of N channel transistor B22ck to function as the input node of this variable delay time inverter. The drain of P channel transistor B22bk becomes the output node of this variable delay time inverter.

The operation of voltage control delay circuit B15 of FIG. 25 will be described hereinafter. Since control voltage Vp1 is applied to the gates of P channel transistors B22a1–B22ak and control voltage Vn is applied to the gates of N channel transistors B22d1–B22dk, a current according to control voltage VCOin flows to each of variable delay time inverters B221–B22k. When control voltage VCOin is increased to result in a greater current flow, the inversion time of an inverter is reduced to shorten the delay time of voltage control delay circuit B15. When control voltage VCOin is reduced to result in a smaller current flow, the inversion time of each inverter is increased to result in a longer delay time of control delay circuit B15.

The operation of the DLL circuit of FIG. 20 will be described hereinafter. When the phase of intermediate clock signal RCLK is behind clock signal ECLK, phase comparator B12 outputs a control signal /UP of a pulse width according to the phase difference between clock signal CLK and intermediate clock signal RCLK, and control signal DOWN of a predetermined pulse width. In response, charge pump B13 causes increase in control voltage VCOin which is the output of the loop filter, so that the delay time of voltage control delay circuit B15 is reduced. Therefore, the phase of intermediate clock signal RCLK is advanced, so that the phase difference between clock signal ECLK and intermediate clock signal RCLK becomes smaller.

Conversely, when the phase of intermediate clock signal RCLK is ahead of clock signal ECLK, phase comparator B12 outputs a control signal DOWN of a pulse width according to the phase difference between intermediate clock signal RCLK and clock signal ECLK and a control signal /UP of a predetermined pulse width. Accordingly, charge is drawn out from loop filter B16 to charge pump B13. This causes reduction in control voltage VCOin, so that the delay time of voltage control delay circuit B15 becomes longer. Therefore, the phase of intermediate clock signal RCLK is delayed. The phase difference between intermediate clock signal RCLK and clock signal ECLK becomes smaller.

Figure 26:
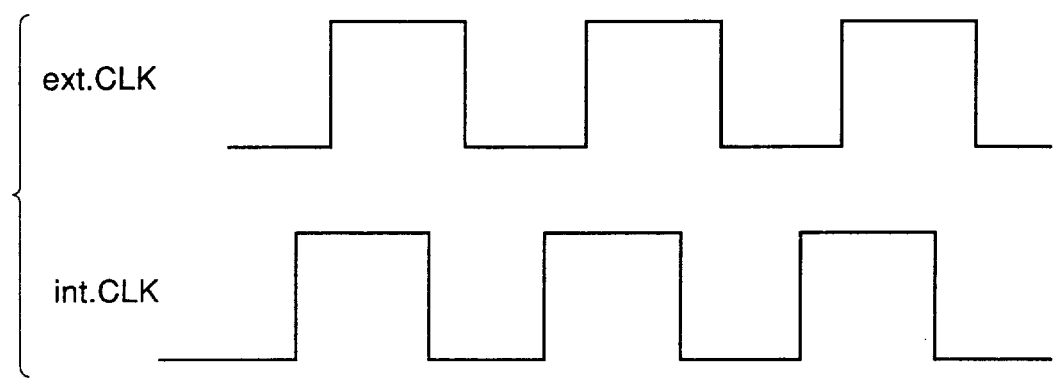
FIG. 26 is a waveform diagram for describing an operation of a DLL circuit DL1 of FIG. 20.
Figure 27:
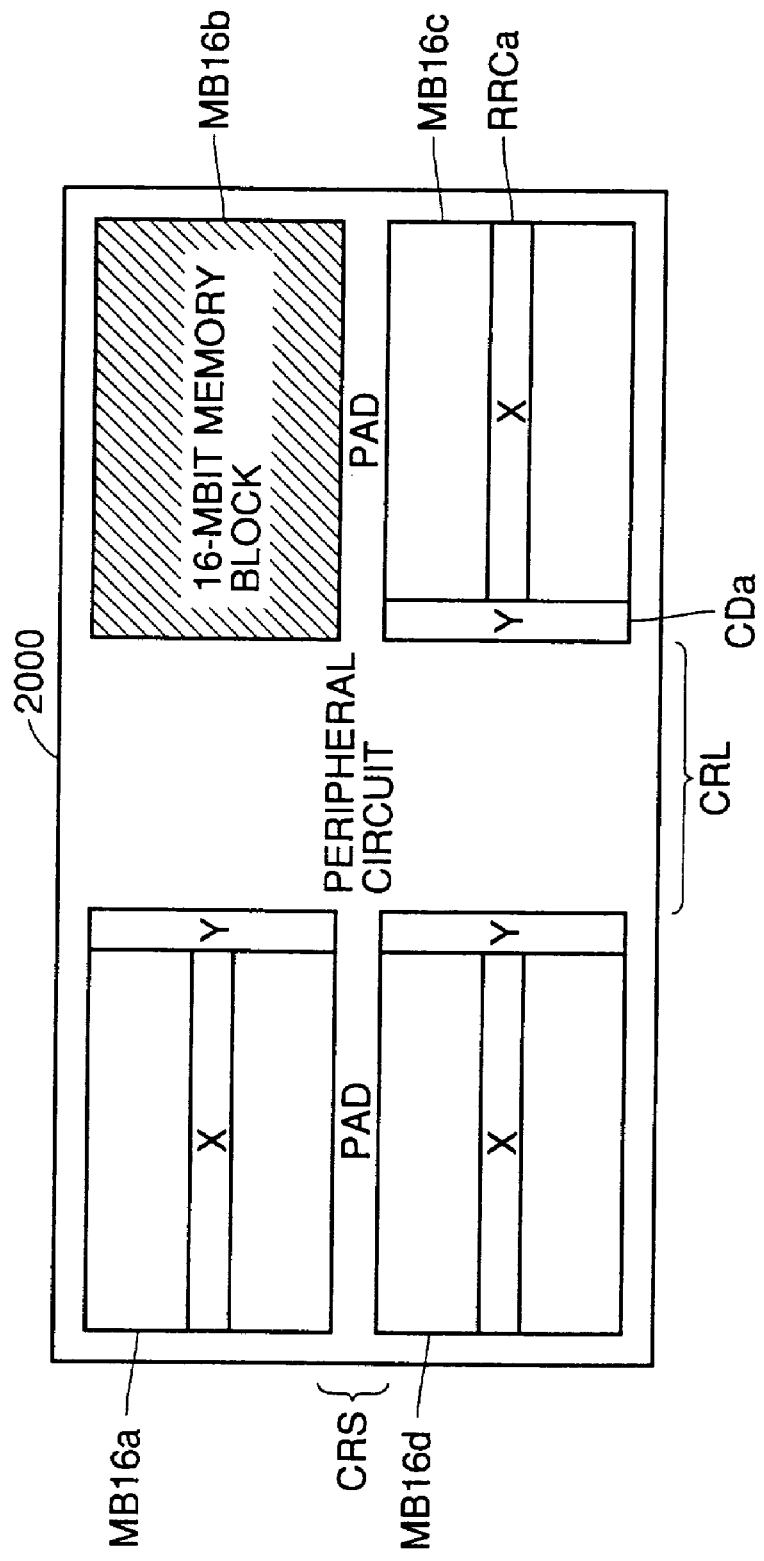
FIG. 27 shows an example of a structure of a conventional 64-Mbit DRAM.
Figure 28:
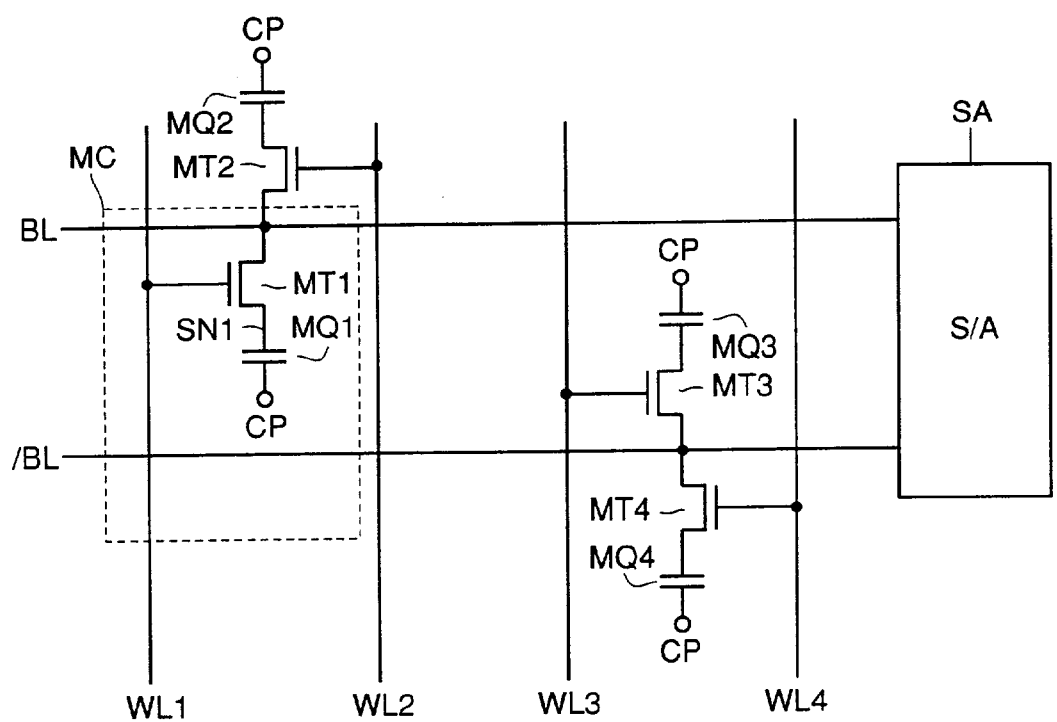
FIG. 28 is a diagram for describing the arrangement of a memory cell, a sense amplifier, a word line, and a bit line.
Figure 29A:
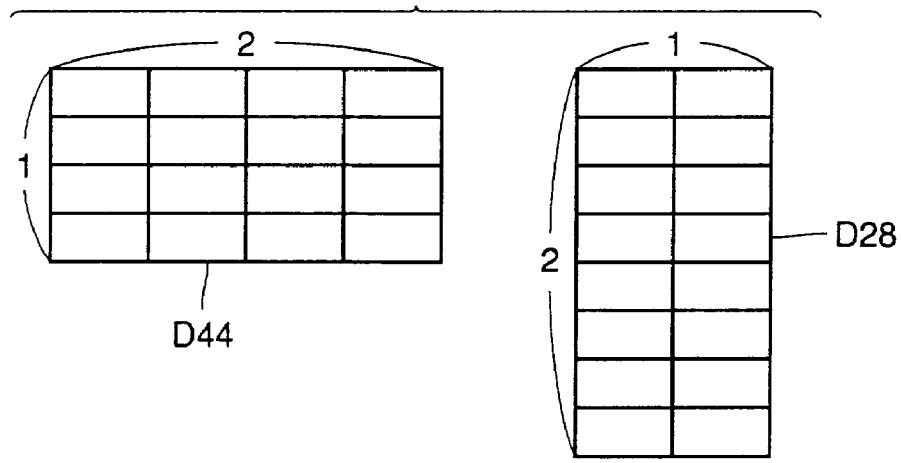
FIG. 29A is a diagram for describing a configuration of memory blocks having a capacity of 2 to the m-th power bits where m is an even number.
Figure 29B:
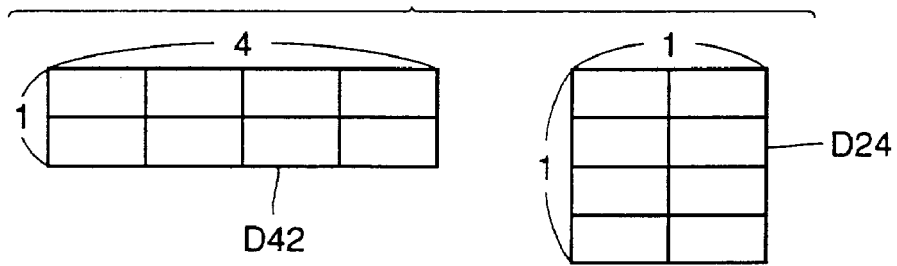
FIG. 29B is a diagram for describing a configuration of a memory block having a capacity of 2 to the m-th power bits where m is an odd number.
Figure 30:
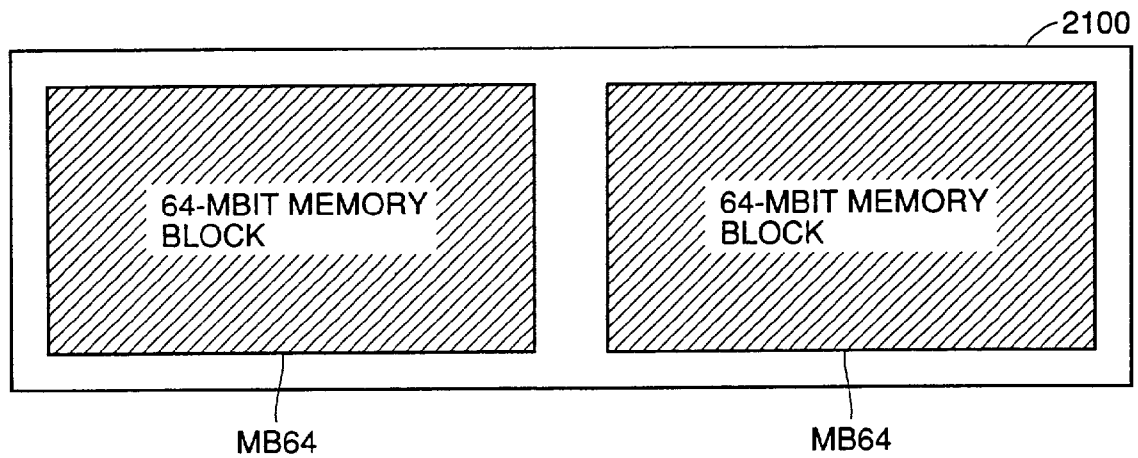
FIG. 30 shows a first example of the configuration where a 128-Mbit DRAM is formed in a conventional method.
Figure 31:
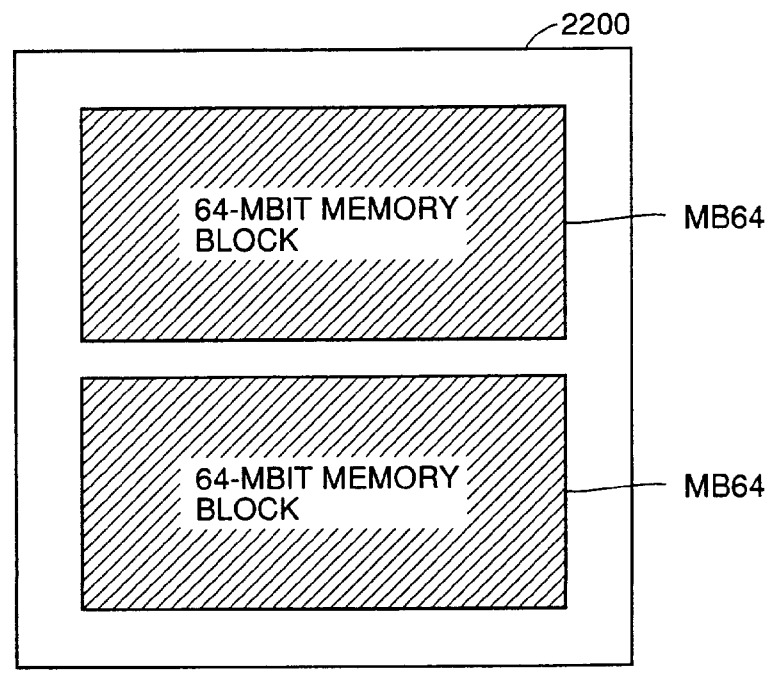
FIG. 31 shows a second example of the configuration where a 128-Mbit DRAM is formed by the conventional method.
Figure 32:
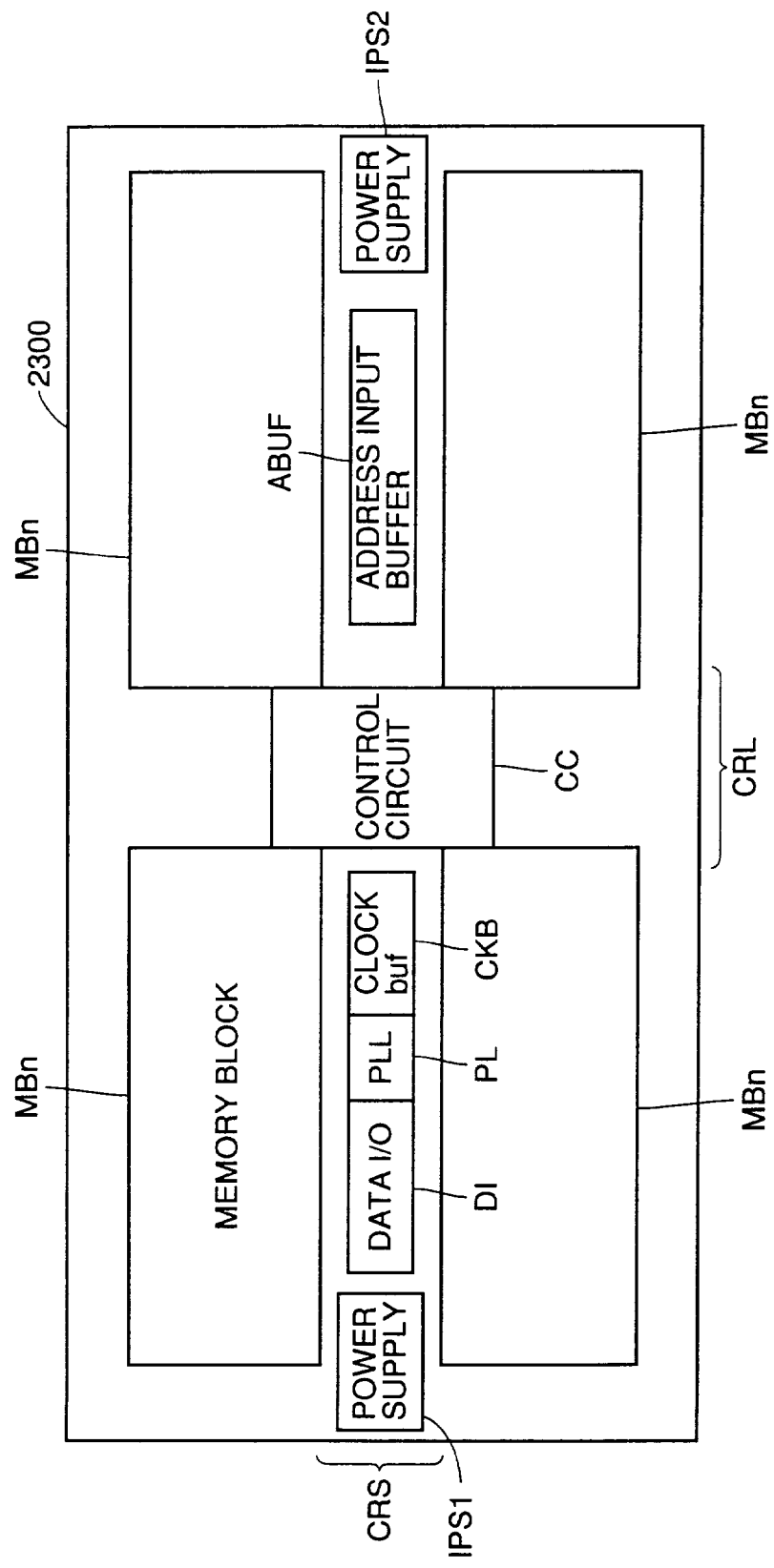
FIG. 32 shows an arrangement of a peripheral circuit in a conventional DRAM.

By repeating the above process, the phase between intermediate clock signal RCLK eventually matches that of clock signal ECLK. Thus, an internal clock signal int.CLK advanced in phase by a desired value than external clock signal ext.CLK is output from clock buffer B14 as shown in FIG. 26.

The above-described DLL circuit is employed in a SDRAM of a high clock frequency, similar to the PLL circuit.

The arrangement of the DLL circuit as shown in FIG. 19 allows the distance to each memory block to be substantially equal. Therefore, the phase offset and skew of the internal clock received by the control circuit of each of the eight memory blocks becomes smaller. Thus, a stable control of a DRAM of a high speed operation can be realized.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device formed at a memory region of a main surface of a semiconductor substrate, comprising:
    a plurality of memory blocks arranged to surround the center of the memory region of the main surface of said semiconductor substrate, each said memory block including:
        (a) a plurality of word lines;
        (b) a plurality of bit lines crossing said plurality of word lines;
        (c) a plurality of memory cells corresponding to crossings of said plurality of word lines and said plurality of bit lines;
        (d) a row decoder connected to said plurality of word lines; and
        (e) a column decoder selecting a bit line from among said plurality of bit lines; and
    a control circuit arranged at a center portion of the memory region of said main surface of said semiconductor substrate for providing control signal to said plurality of memory blocks, said control circuit including:
        (a) a master control circuit arranged at a center of said control circuit and generating a reference signal by which all of said plurality of memory blocks operate accordingly; and
        (b) a plurality of local control circuits arranged to surround said master control circuit, each local control circuit receiving said reference signal to output said control signal to a corresponding memory block.

2. The semiconductor memory device according to claim 1, wherein said control circuit further comprises a clock input terminal for receiving an external clock, wherein said master control circuit includes an internal clock generation circuit generating an internal clock according to said external clock, and each said local control circuit provides said control signal according to said internal clock.

3. The semiconductor memory device according to claim 2, wherein said internal clock generation circuit comprises a PLL (Phase Locked Loop) circuit receiving said external clock to generate said internal clock in phase with said external clock.

4. The semiconductor memory device according to claim 2, wherein said internal clock generation circuit comprises a DLL (Delayed Locked Loop) circuit receiving and delaying said external clock to generate said internal clock having a predetermined phase difference from said external clock.

5. The semiconductor memory device according to claim 1, wherein said memory region has a rectangular shape, each of said plurality of memory blocks has a rectangular shape, said center portion has a rectangular shape, said plurality of local control circuits are provided corresponding to said plurality of memory blocks, and each said local control circuit is arranged at one of four corners of said center portion that is closest to a corresponding memory block.

6. The semiconductor memory device according to claim 5, wherein said semiconductor memory device has a memory capacity of $2^{2m+1}$ bits, said plurality of memory blocks all have equal memory capacity, and each said memory block has a rectangular shape with an aspect ratio of 1:2.

7. The semiconductor memory device according to claim 5, further comprising a data bus provided corresponding to each said memory block and having at least one portion arranged along said column decoder of a corresponding one of said memory blocks, wherein said control circuit further comprises a pad receiving an externally applied address signal, and a pad receiving an externally applied data signal, said master control circuit comprises a predecode circuit predecoding said address signal, each said local control circuit comprises an output circuit providing an output of said predecode circuit to said row decoder according to an activation signal of said corresponding memory block, and said row decoder and column decoder are provided along first and second sides out of four sides of said memory block, closest to said local control circuit.

* * * * *